US011546019B2

(12) United States Patent
Baldwin et al.

(10) Patent No.: US 11,546,019 B2
(45) Date of Patent: Jan. 3, 2023

(54) APPARATUS FOR MINIMIZING ELECTROMAGNETIC COUPLING BETWEEN SURFACE MOUNT DEVICE INDUCTORS

(71) Applicant: Skyworks Solutions, Inc., Woburn, MA (US)

(72) Inventors: John C. Baldwin, Simi Valley, CA (US); Weimin Sun, Santa Rosa Valley, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 432 days.

(21) Appl. No.: 16/707,776

(22) Filed: Dec. 9, 2019

(65) Prior Publication Data

US 2020/0186202 A1 Jun. 11, 2020

Related U.S. Application Data

(60) Provisional application No. 62/777,509, filed on Dec. 10, 2018.

(51) Int. Cl.
| | | |
|---|---|---|
| *H04B 5/00* | (2006.01) |
| *H05K 1/02* | (2006.01) |
| *H01F 27/28* | (2006.01) |
| *H01F 27/32* | (2006.01) |
| *H01F 27/36* | (2006.01) |

(52) U.S. Cl.
CPC .......... *H04B 5/0081* (2013.01); *H01F 27/28* (2013.01); *H01F 27/2885* (2013.01); *H01F 27/32* (2013.01); *H01F 27/363* (2020.08); *H05K 1/0216* (2013.01); *H05K 1/0243* (2013.01); *H05K 2201/1003* (2013.01)

(58) Field of Classification Search
CPC ........................ H01F 2017/088; H01F 27/288
See application file for complete search history.

(56) References Cited

U.S. PATENT DOCUMENTS

| | | | | |
|---|---|---|---|---|
| 2017/0330669 | A1* | 11/2017 | Tomonari | H01F 5/003 |
| 2018/0096783 | A1* | 4/2018 | Fukuda | H01F 27/366 |
| 2019/0189327 | A1* | 6/2019 | Kim | H04B 1/40 |
| 2019/0199310 | A1* | 6/2019 | Sato | H01G 4/40 |
| 2019/0279813 | A1* | 9/2019 | Jang | H01F 27/361 |
| 2020/0027649 | A1* | 1/2020 | Yang | H01F 27/361 |
| 2020/0090850 | A1* | 3/2020 | Isobe | H01F 17/04 |
| 2021/0320461 | A1* | 10/2021 | Buck | H01R 13/03 |

* cited by examiner

*Primary Examiner* — Wen W Huang
(74) *Attorney, Agent, or Firm* — Knobbe, Martens, Olson & Bear LLP

(57) ABSTRACT

A surface mount device inductor has a package casing sized to attenuate electromagnetic coupling between the inductor coils of the surface mount device inductors. The package casing makes the surface mount device inductors self-shielding. The surface mount device inductors can be incorporated into a radiofrequency module, and can be incorporated into a front end system of a wireless mobile device.

21 Claims, 24 Drawing Sheets

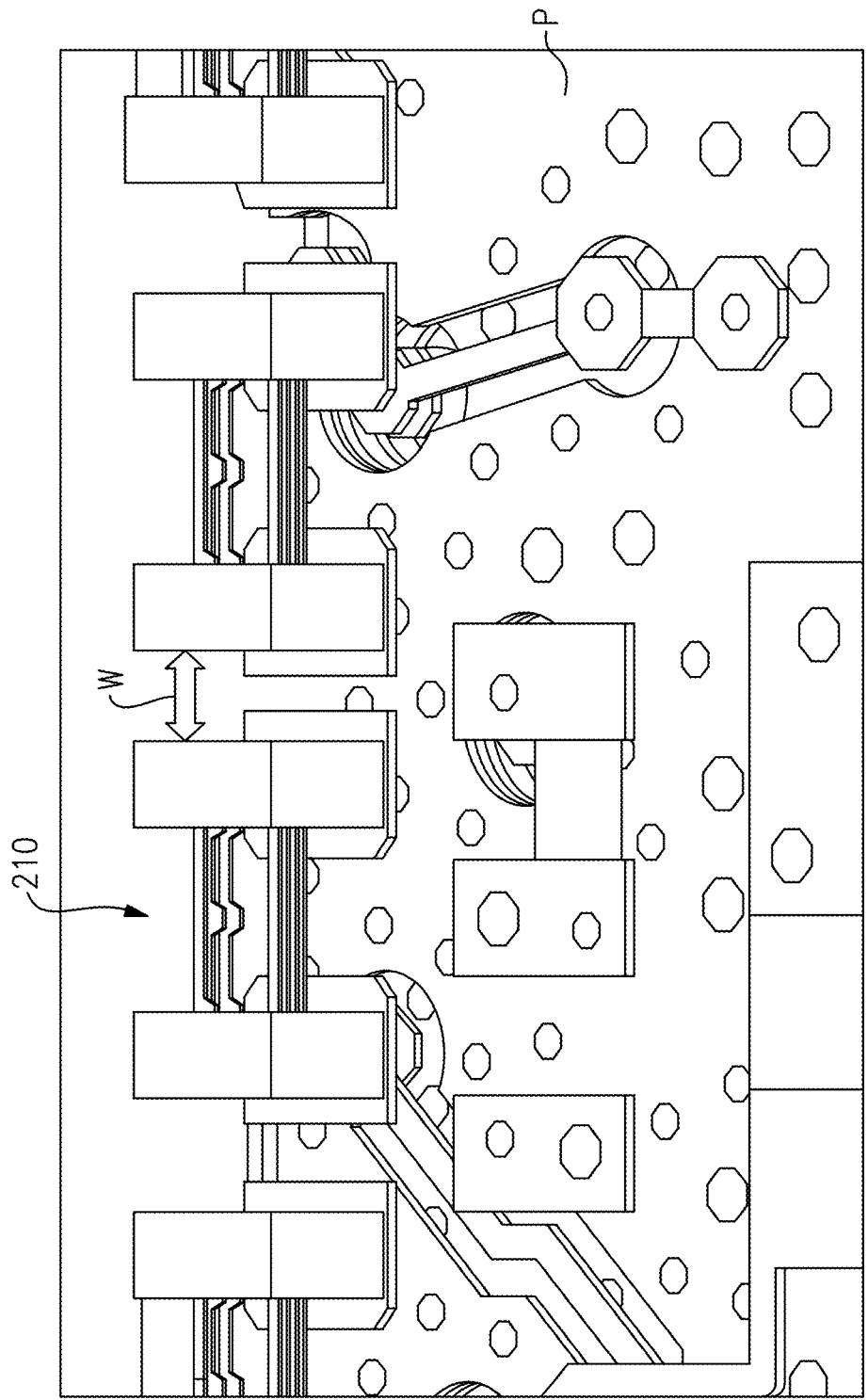

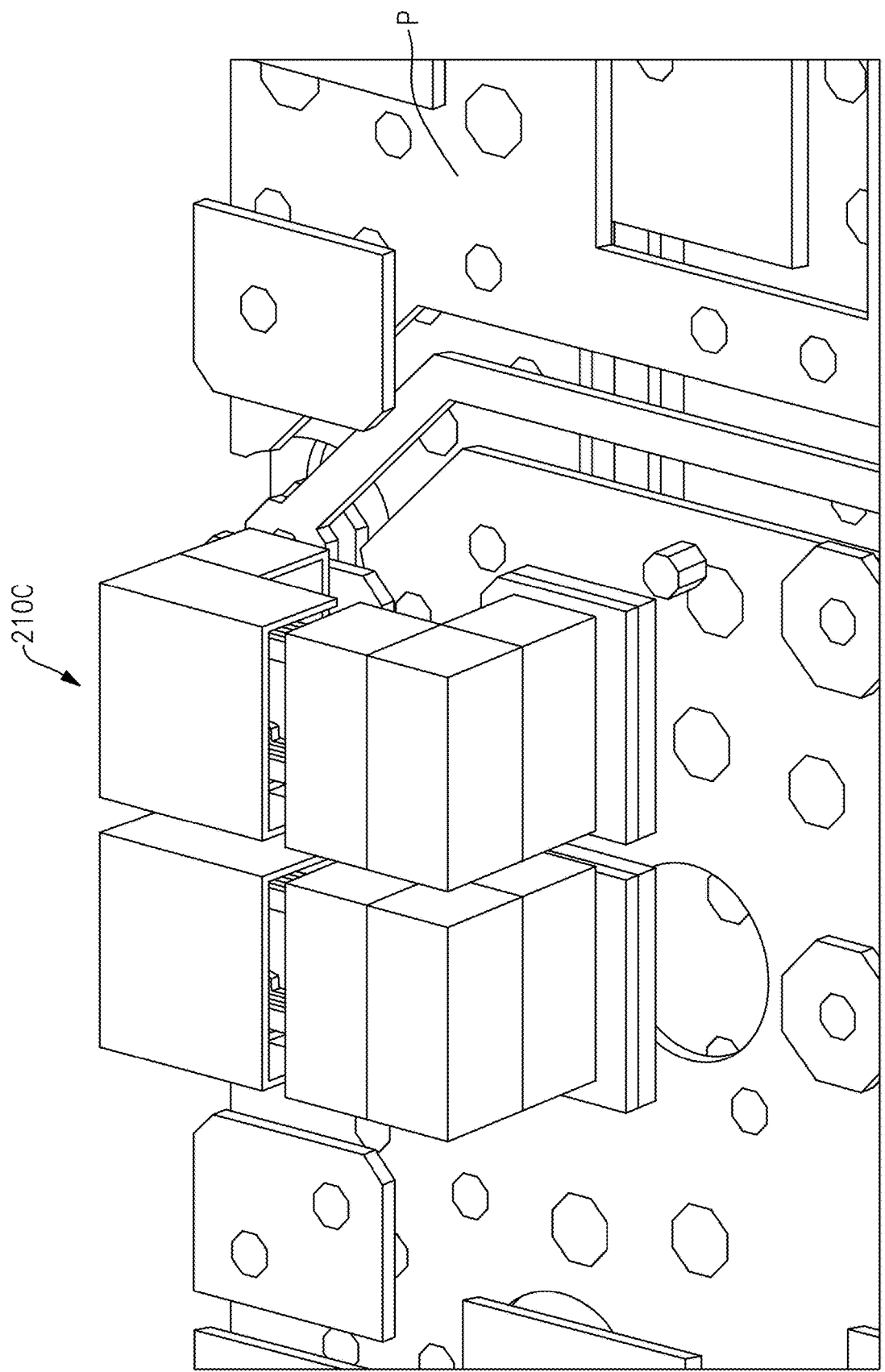

APPARATUS FOR MINIMIZING ELECTROMAGNETIC COUPLING BETWEEN SURFACE MOUNT DEVICE INDUCTORS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Aspects of the disclosure relate to a surface mount device (SMD) inductors, and more particularly to an apparatus for minimizing electromagnetic coupling between SMD inductors.

Description of the Related Art

Surface mount device (SMD) inductors are used for tuning both transmit (Tx) and receive (Rx) performance in radio frequency power amplifier modules. However, adequate isolation of the Rx path from the Tx path is important to obtain the best possible performance. Insufficient isolation results in poor harmonic performance and Rx de-sense. Moreover, electromagnetic coupling between SMD inductors can be high in small module packages, and is often responsible for poor isolation between the Tx, Rx and antenna paths in a module. In fact, crosstalk between SMD inductors, in for example a cell phone front end module, is a major problem that degrades module performance. As module sizes continue to decrease over time, inductor crosstalk may continue to increase.

SUMMARY

Accordingly, there is a need for apparatus and methods for shielding SMD inductors to reduce (e.g., minimize) crosstalk between the SMD inductors as much as possible.

In accordance with one aspect of the disclosure, a module is provided with SMD inductors that have a package casing sized to attenuate electromagnetic coupling between the inductor coils of the SMD inductors. The package casing makes the SMD inductors self-shielding.

In accordance with one aspect of the disclosure, the anode and cathode structures (e.g., metal portions) of the inductor in an SMD inductor are modified (e.g., extended) to provide shielding over the inductor coil area of the SMD inductor. Optionally, the metal portions can provide increased shielding over the top half of the inductor body for either horizontal or vertical coils of an SMD inductor. Optionally, a single grounded plate can be used with a horizontally oriented coil to provide increased shielding for the SMD inductor.

In accordance with one aspect of the disclosure, a surface mount device inductor mountable on a printed circuit board is provided. The surface mount device inductor comprises an inductor coil configured to generate a magnetic field along an axis when a current is applied to the inductor coil, a dielectric material disposed about the inductor coil, an anode structure disposed over a first end of the inductor coil, and a cathode structure disposed over a second end of the inductor coil opposite the first end. A shield portion is disposed at least partially over the inductor coil and extending along a plane that extends generally transverse to the axis to thereby reduce electromagnetic coupling between adjacent surface mount device inductors.

In accordance with another aspect of the disclosure, a radiofrequency module is provided. The radiofrequency module comprises a printed circuit board including a substrate layer. The radiofrequency module also comprises one or more surface mount device inductors mounted on the substrate layer. Each surface mount device inductor includes: an inductor coil configured to generate a magnetic field along an axis when a current is applied to the inductor coil; a dielectric material disposed about the inductor coil; an anode structure disposed over a first end of the inductor coil; a cathode structure disposed over a second end of the inductor coil opposite the first end; and a shield portion disposed at least partially over the inductor coil and extending along a plane extending generally transverse to the axis to thereby reduce electromagnetic coupling between adjacent surface mount device inductors.

In accordance with another aspect of the disclosure, a wireless mobile device is provided. The wireless mobile device comprises one or more antennas and a front end system that communicates with the one or more antennas. The front end system includes one or more surface mount device inductors mounted on a substrate layer. Each surface mount device inductor includes: an inductor coil configured to generate a magnetic field along an axis when a current is applied to the inductor coil; a dielectric material disposed about the inductor coil; an anode structure disposed over a first end of the inductor coil; a cathode structure disposed over a second end of the inductor coil opposite the first end; and a shield portion disposed at least partially over the inductor coil and extending along a plane extending generally transverse to the axis to thereby reduce electromagnetic coupling between adjacent surface mount device inductors.

BRIEF DESCRIPTION OF THE DRAWINGS

FIG. 9A is a schematic view of a packaged module with conventional spaced part SMD inductors with horizontally oriented inductors.

FIG. 13A is a schematic view of a packaged module with side by side SMD inductors with horizontally oriented inductors and increased shielding.

DETAILED DESCRIPTION

Figure 1:
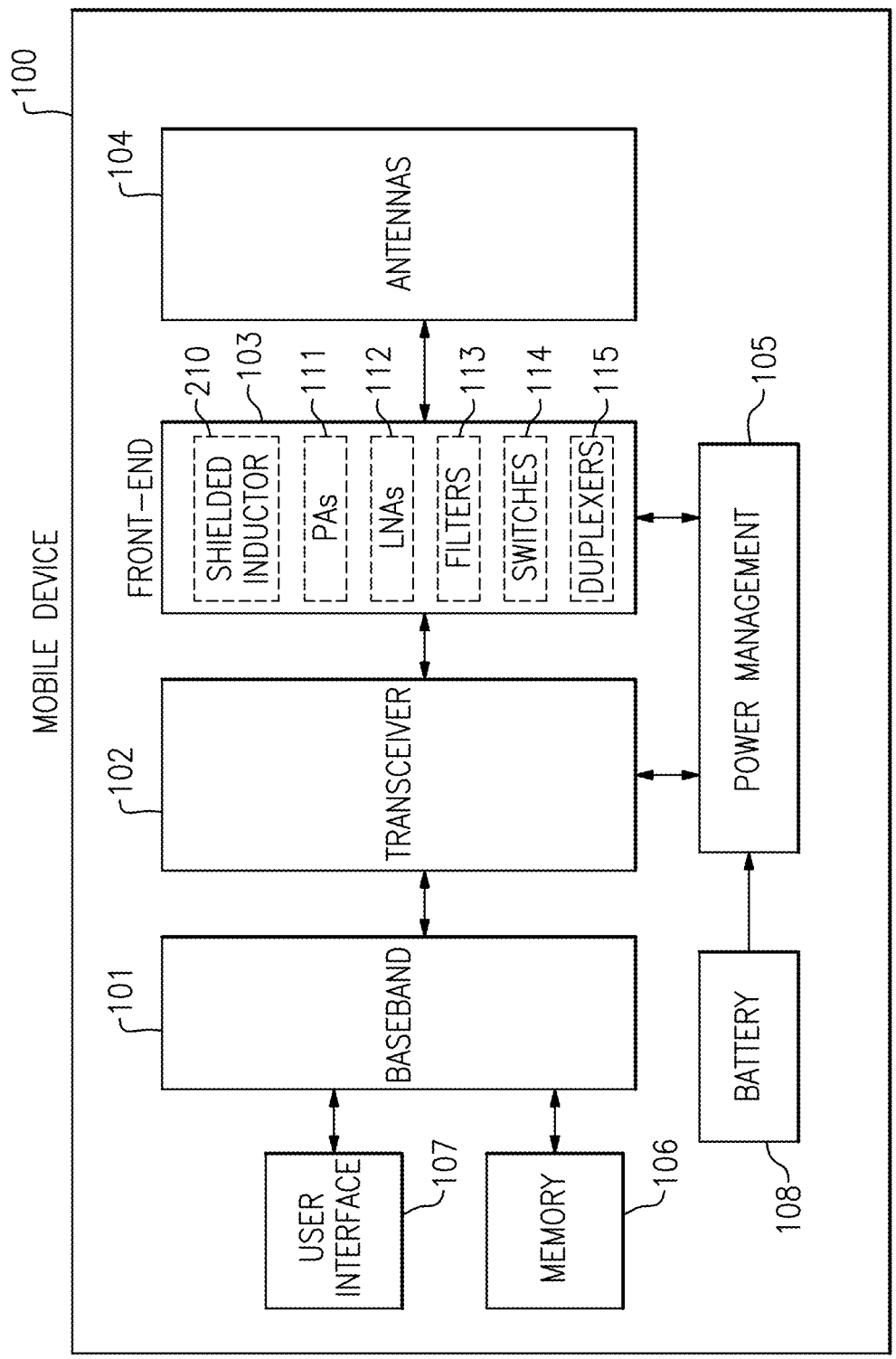
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings were like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP introduced Phase 1 of fifth generation (5G) technology in Release 15 and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one embodiment of a mobile device 100. The mobile device 100 includes a baseband system 101, a transceiver 102, a front end system 103, one or more antennas 104, a power management system 105, a memory 106, a user interface 107, and a battery 108.

The mobile device 100 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receiving of RF signals can be achieved by one or more components that are collectively represented in FIG. 1 as the transceiver 102. In one example, separate components (for instance, separate circuits or dies) can be provided for handling certain types of RF signals.

The front end system 103 aids in conditioning signals transmitted to and/or received from the antennas 104. In the illustrated embodiment, the front end system 103 includes one or more shielded inductors 210, power amplifiers (PAs) 111, low noise amplifiers (LNAs) 112, filters 113, switches 114, and duplexers 115. However, other implementations are possible.

For example, the front end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 104 can include antennas used for a wide variety of types of communications. For example, the antennas 104 can include antennas for transmitting and/or receiving signals associated with a wide variety of frequencies and communications standards.

In certain implementations, the antennas 104 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front end system 103 can include phase shifters having variable phase controlled by the transceiver 102. Additionally, the phase shifters are controlled to provide beam formation and directivity for transmission and/or reception of signals using the antennas 104. For example, in the context of signal transmission, the phases of the transmit signals provided to the antennas 104 are controlled such that radiated signals from the antennas 104 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 104 from a particular direction. In certain implementations, the antennas 104 include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 102. As shown in FIG. 1, the baseband system 101 is coupled to the memory 106 of facilitate operation of the mobile device 100.

The memory 106 can be used for a wide variety of purposes, such as storing data and/or instructions to facilitate the operation of the mobile device 100 and/or to provide storage of user information.

The power management system 105 provides a number of power management functions of the mobile device 100. In certain implementations, the power management system 105 includes a PA supply control circuit that controls the supply voltages of the power amplifiers 111. For example, the power management system 105 can be configured to change the supply voltage(s) provided to one or more of the power amplifiers 111 to improve efficiency, such as power added efficiency (PAE).

As shown in FIG. 1, the power management system 105 receives a battery voltage from the battery 108. The battery 108 can be any suitable battery for use in the mobile device 100, including, for example, a lithium-ion battery.

Figure 2A:
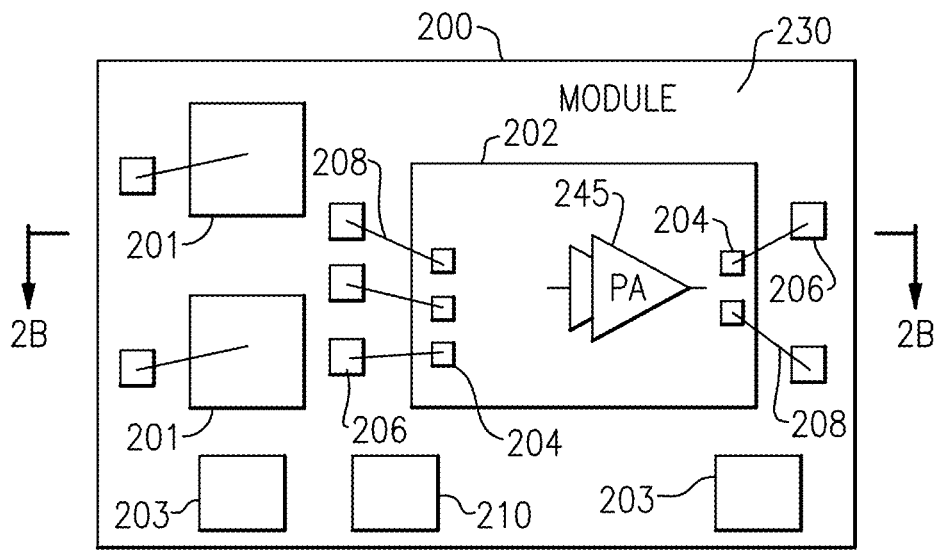
FIG. 2A is a schematic diagram of one embodiment of a packaged module.
Figure 2B:
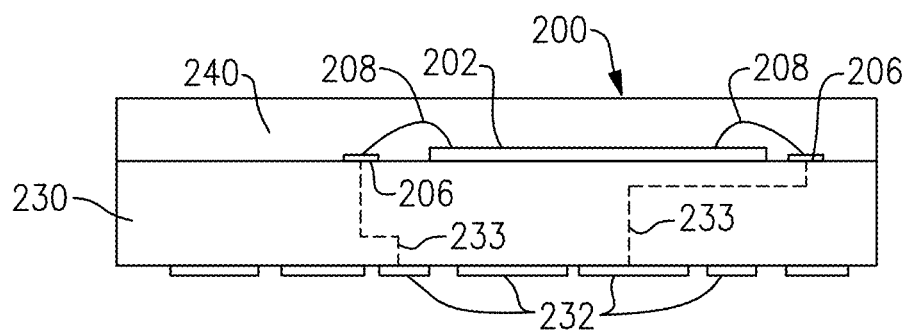
FIG. 2B is a schematic diagram of a cross-section of the packaged module of FIG. 2A taken along the lines 2B-2B.

FIG. 2A is a schematic diagram of one embodiment of a packaged module 200. FIG. 2B is a schematic diagram of a cross-section of the packaged module 200 of FIG. 2A taken along the lines 2B-2B.

The packaged module 200 includes radio frequency components 201, a semiconductor die 202, surface mount devices 203, wirebonds 208, a package substrate 230, and an encapsulation structure 240. One or more of the surface mounted devices (SMDs) 203 can be a shielded inductor 210. The package substrate 230 includes pads 206 formed from conductors disposed therein. Additionally, the semiconductor die 202 includes pins or pads 204, and the wirebonds 208 have been used to connect the pads 204 of the die 202 to the pads 206 of the package substrate 220.

The semiconductor die 202 includes a power amplifier 245, which can be implemented in accordance with one or more features disclosed herein.

The packaging substrate 230 can be configured to receive a plurality of components such as radio frequency components 201, the semiconductor die 202 and the surface mount devices 203, which can include, for example, surface mount capacitors and/or inductors. In one implementation, the radio frequency components 201 include integrated passive devices (IPDs).

As shown in FIG. 2B, the packaged module 200 is shown to include a plurality of contact pads 232 disposed on the side of the packaged module 200 opposite the side used to mount the semiconductor die 202. Configuring the packaged module 200 in this manner can aid in connecting the packaged module 200 to a circuit board, such as a phone board of a mobile device. The example contact pads 232 can be configured to provide radio frequency signals, bias signals, and/or power (for example, a power supply voltage and ground) to the semiconductor die 202 and/or other components. As shown in FIG. 2B, the electrical connections between the contact pads 232 and the semiconductor die 202 can be facilitated by connections 233 through the package substrate 230. The connections 233 can represent electrical paths formed through the package substrate 220, such as connections associated with vias and conductors of a multilayer laminated package substrate.

In some embodiments, the packaged module 200 can also include one or more packaging structures to, for example, provide protection and/or facilitate handling.

Such a packaging structure can include overmold or encapsulation structure 240 formed over the packaging substrate 230 and the components and die(s) disposed thereon.

It will be understood that although the packaged module 200 is described in the context of electrical connections based on wirebonds, one or more features of the present disclosure can also be implemented in other packaging configurations, including, for example, flip-chip configurations.

Shielded Inductor

Figure 3:
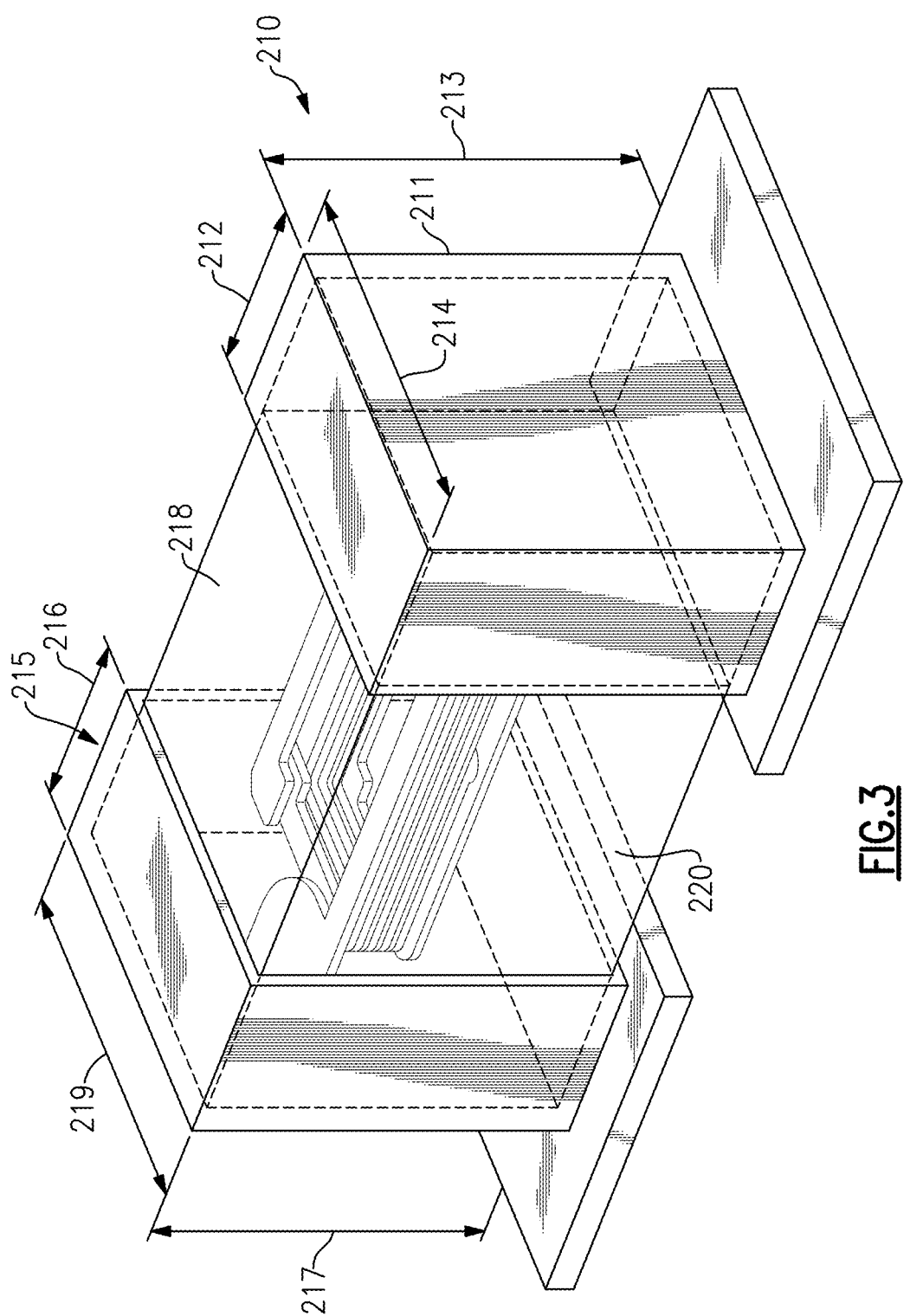
FIG. 3 is a schematic view of a conventional SMD inductor with a horizontally oriented inductor.

FIG. 3 shows a conventional surface mount inductor 210 (baseline inductor) with no additional shielding. The inductor 210 includes an anode structure 211 a cathode structure 215, an induction coil 220, and a dielectric structure 218. The anode and cathode structures 211, 215 can be made of metal, have a box-like shape, and cover the ends of the inductor coil 220 and extend over at least a portion of the inductor coil 220 and the dielectric structure 218. The inductor coil 220 extends vertically (e.g., so an axis of the magnetic field extends generally vertically, or generally parallel to the height 213, 217 of the anode structure 211 and cathode structure 215). In operation, an electric and magnetic field radiate from the inductor coil 220 when a current passes through it. Inductors with a higher Q (or Quality) factor will radiate more than inductors with a low Q factor (e.g., experience less loss). The anode structure 211 extends over a length 212, a height 213 and a width 214, and the cathode structure 215 extends over a length 216, a height 217 and a width 219. In one embodiment, the shielded inductor 210 can provide an inductance of 6.32 nH at a frequency of 800 MHz and have a Q factor of 25.5.

Figure 4:
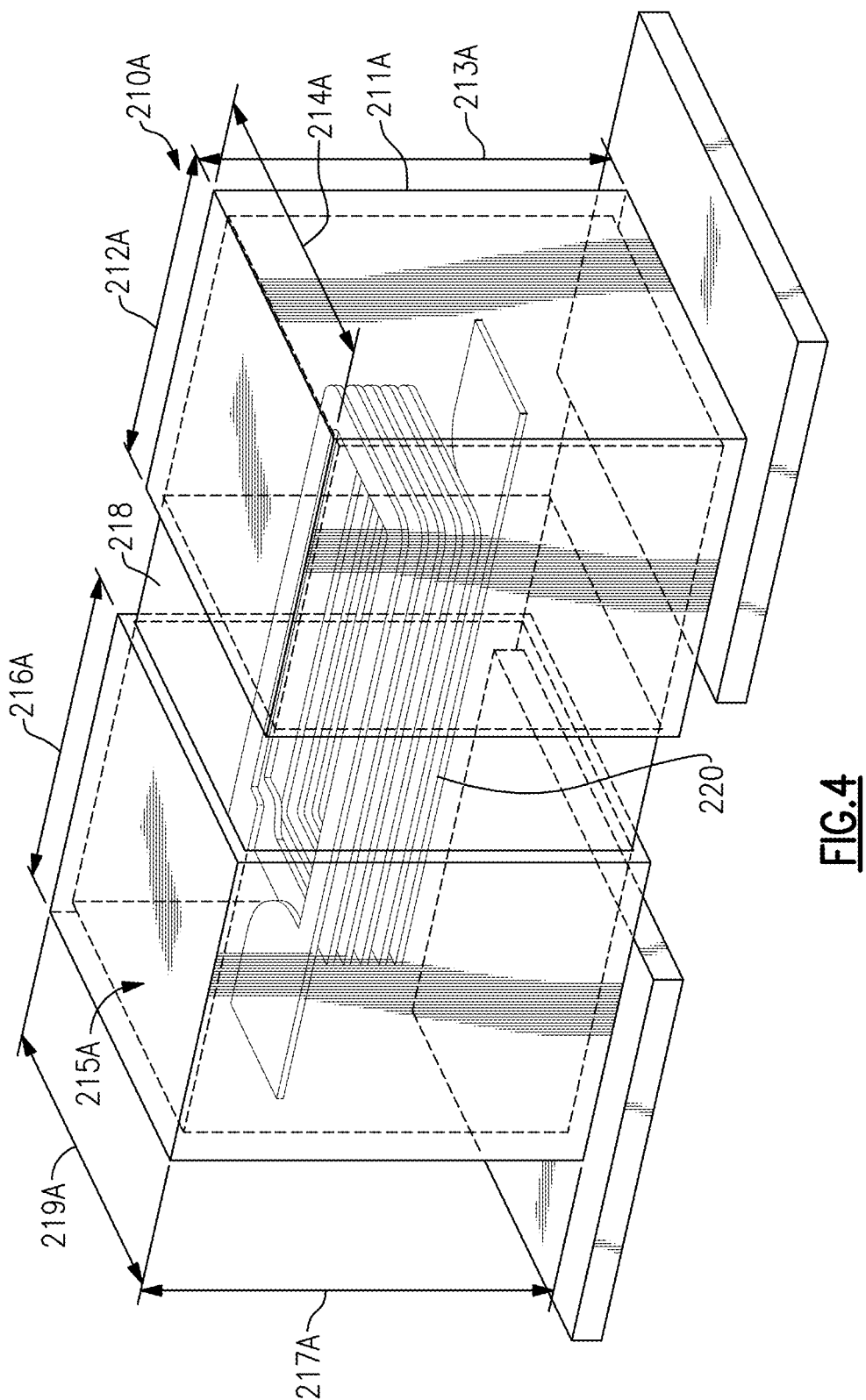
FIG. 4 is a schematic view of an SMD inductor with increased shielding.

FIG. 4 shows an embodiment of a shielded inductor 210A with additional shielding relative to the surface mount inductor 210. Some of the features of shielded inductor 210A are similar to features of the surface mount inductor 210 in FIG. 3. Thus, references numerals used to designate the various components of the shielded inductor 210A are identical to those used for identifying the corresponding components of the surface mount inductor 210 in FIG. 3, except that an "A" is added to the numerical identifiers. Therefore, the structure and description for the various features of the surface mount inductor 210 in FIG. 3 are understood to also apply to the corresponding features of the shielded inductor 210A in FIG. 4, except as described below.

The shielded inductor 210A differs from the surface mount inductor 210 in that the length 212A of the anode structure 211A and the length 216A of the cathode structure 215A is increased inward toward a center or midpoint of a length of the shielded inductor 210A so that more of the inductor coil 220 is covered. Optionally, the length 212A of the anode structure 211A and the length 216A of the cathode structure 215A are increased approximately 100 μm toward a center or midpoint of the length of the shielded inductor 210A relative to the lengths 212, 216 of the anode and cathode structure 211, 216 of the shielded inductor 210. In one embodiment, the shielded inductor 210A can provide an inductance of 5.88 nH and have a Q factor of 22.6, and therefore exhibits a poorer performance relative to the shielded inductor 210.

Figure 5:
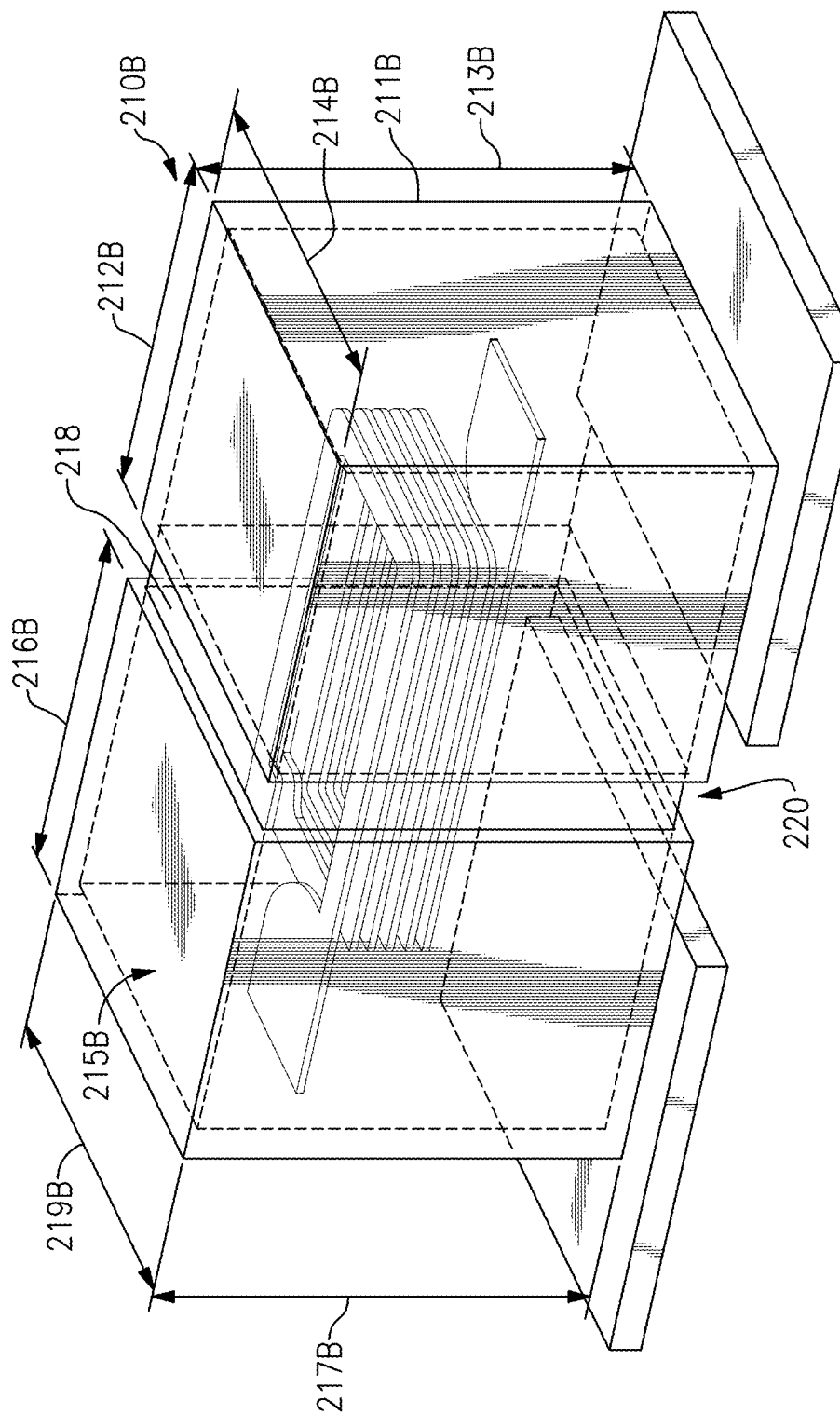
FIG. 5 is a schematic view of another SMD inductor with increased shielding.

FIG. 5 shows an embodiment of a shielded inductor 210B with additional shielding relative to the surface mount inductor 210. Some of the features of shielded inductor 210B are similar to features of the surface mount inductor 210 in FIG. 3. Thus, references numerals used to designate the various components of the shielded inductor 210B are identical to those used for identifying the corresponding components of the surface mount inductor 210 in FIG. 3, except that a "B" is added to the numerical identifiers. Therefore, the structure and description for the various features of the surface mount inductor 210 in FIG. 3 are understood to also apply to the corresponding features of the shielded inductor 210B in FIG. 5, except as described below.

The shielded inductor 210B differs from the surface mount inductor 210 in that the length 212B of the anode structure 211B and the length 216B of the cathode structure 215B is increased inward toward a center or midpoint of a length of the shielded inductor 210B so that more of the inductor coil 220 is covered. Optionally, the length 212B of the anode structure 211B and the length 216B of the cathode structure 215B are increased approximately 130 μm toward a center or midpoint of the length of the shielded inductor 210B relative to the lengths 212, 216 of the anode and cathode structure 211, 216 of the shielded inductor 210. In one embodiment, the shielded inductor 210B can provide an inductance of 5.63 nH and have a Q factor of 20.9, and therefore exhibits a poorer performance as compared to the shielded inductor 210A.

Figure 6:
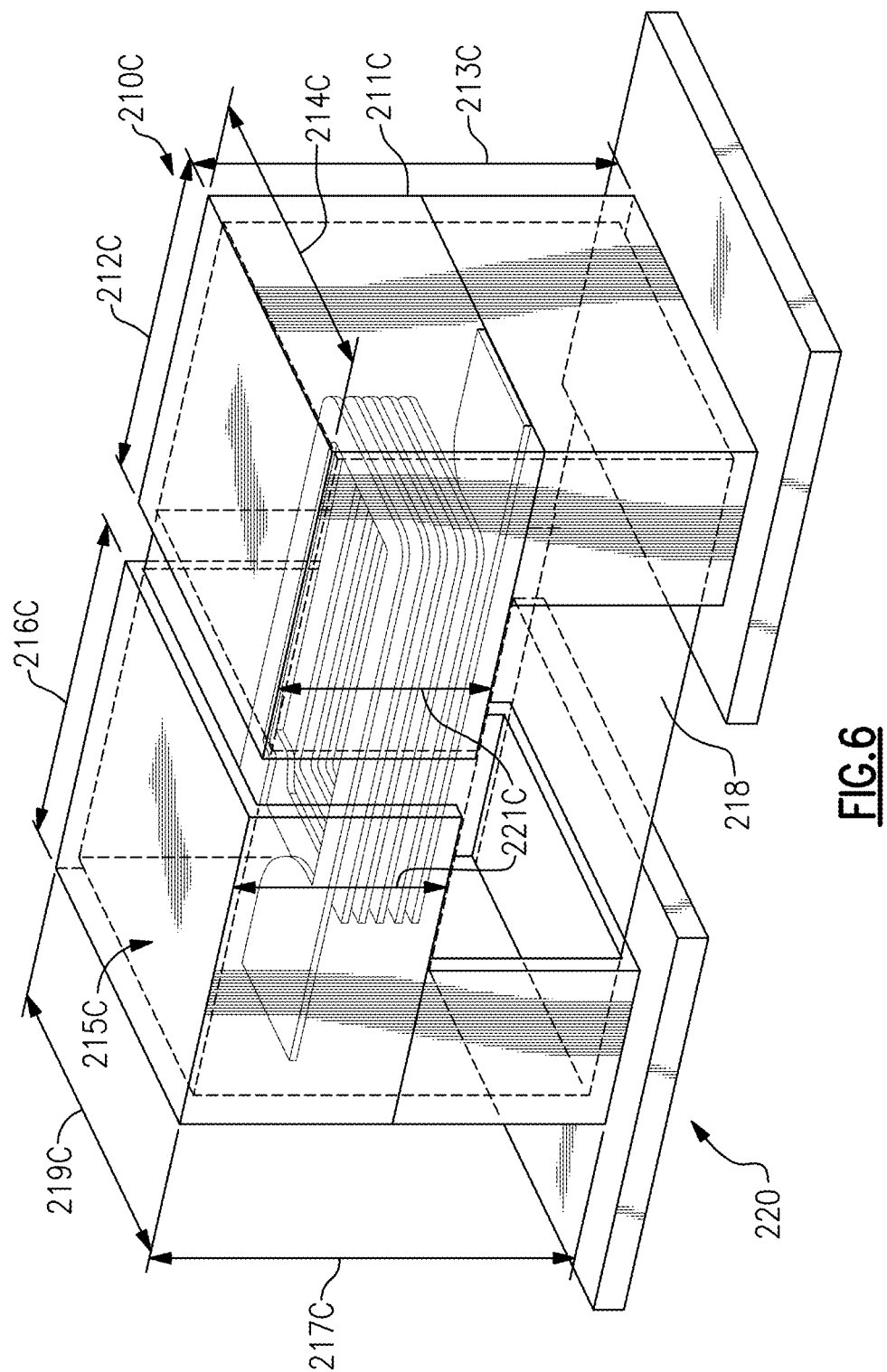
FIG. 6 is a schematic view of another SMD inductor with increased shielding.

FIG. 6 shows an embodiment of a shielded inductor 210C with additional shielding relative to the surface mount inductor 210. Some of the features of shielded inductor 210C are similar to features of the shielded inductor 210B in FIG. 5. Thus, references numerals used to designate the various components of the shielded inductor 210C are identical to those used for identifying the corresponding components of the shielded inductor 210B in FIG. 5, except that a "C" is added to the numerical identifiers. Therefore, the structure and description for the various features of the shielded inductor 210B in FIG. 5 are understood to also apply to the corresponding features of the shielded inductor 210C in FIG. 6, except as described below.

The shielded inductor 210C differs from the shielded inductor 210B in that the anode structure 211C and cathode structure 215C cover only a top portion (e.g., top half) of the inductor assembly (e.g., so that a bottom portion of the inductor assembly is exposed). For example, the anode structure 211C and cathode structure 215C extend along a height 221C that is smaller than (e.g., about half the length) of the height 213C, 217C of the anode structure 211C and cathode structure 215C. The anode structure 211C and cathode structure 215C have the same lengths 212C, 216C as the corresponding lengths 212B, 216B of the shielded inductor 210B. Optionally, the length 212C of the anode structure 211C and the length 216C of the cathode structure 215C are increased approximately 130 μm toward a center or midpoint of the length of the shielded inductor 210C relative to the lengths 212, 216 of the anode and cathode structure 211, 216 of the shielded inductor 210. In one embodiment, the shielded inductor 210C can provide an inductance of 5.85 nH and have a Q factor of 22.1, and therefore exhibits better performance than the shielded conductor 210B.

Figure 7:
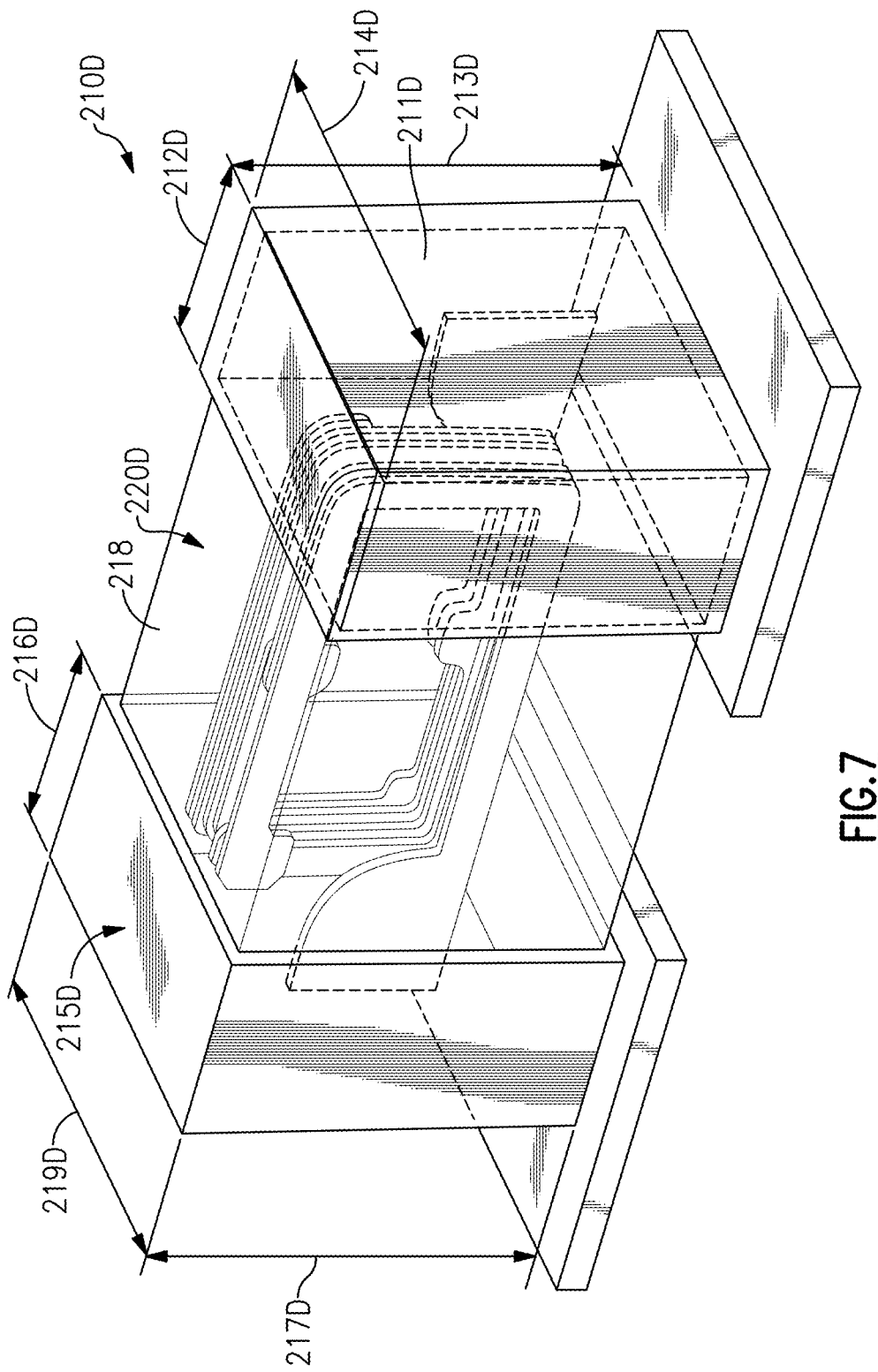
FIG. 7 is a schematic view of a conventional SMD inductor with a vertically oriented inductor.

FIG. 7 shows a conventional surface mount inductor 210D (baseline inductor) with no additional shielding and having an inductor coil 220D that extends horizontally (e.g., so an axis of the magnetic field extends generally horizontally, or generally parallel to the width 214D, 219D of the anode structure 211D and cathode structure 215D). The inductor 210D includes the anode structure 211D, the cathode structure 215D, the induction coil 220D and a dielectric structure (not shown but similar to 218 in FIG. 3). The anode and cathode structures 211D, 215D can be made of metal and cover the ends of the inductor coil 220D and extend over at least a portion of the inductor coil 220D and the dielectric structure. In operation, an electric and magnetic field radiate from the inductor coil 220D when a current passes through it. The anode structure 211D extends over a length 212D, a height 213D and a width 214D, and the cathode structure 215D extends over a length 216D, a height 217D and a width 219D. In one embodiment, the shielded inductor 210D can provide an inductance of 6.06 nH and have a Q factor of 25.

Figure 8:
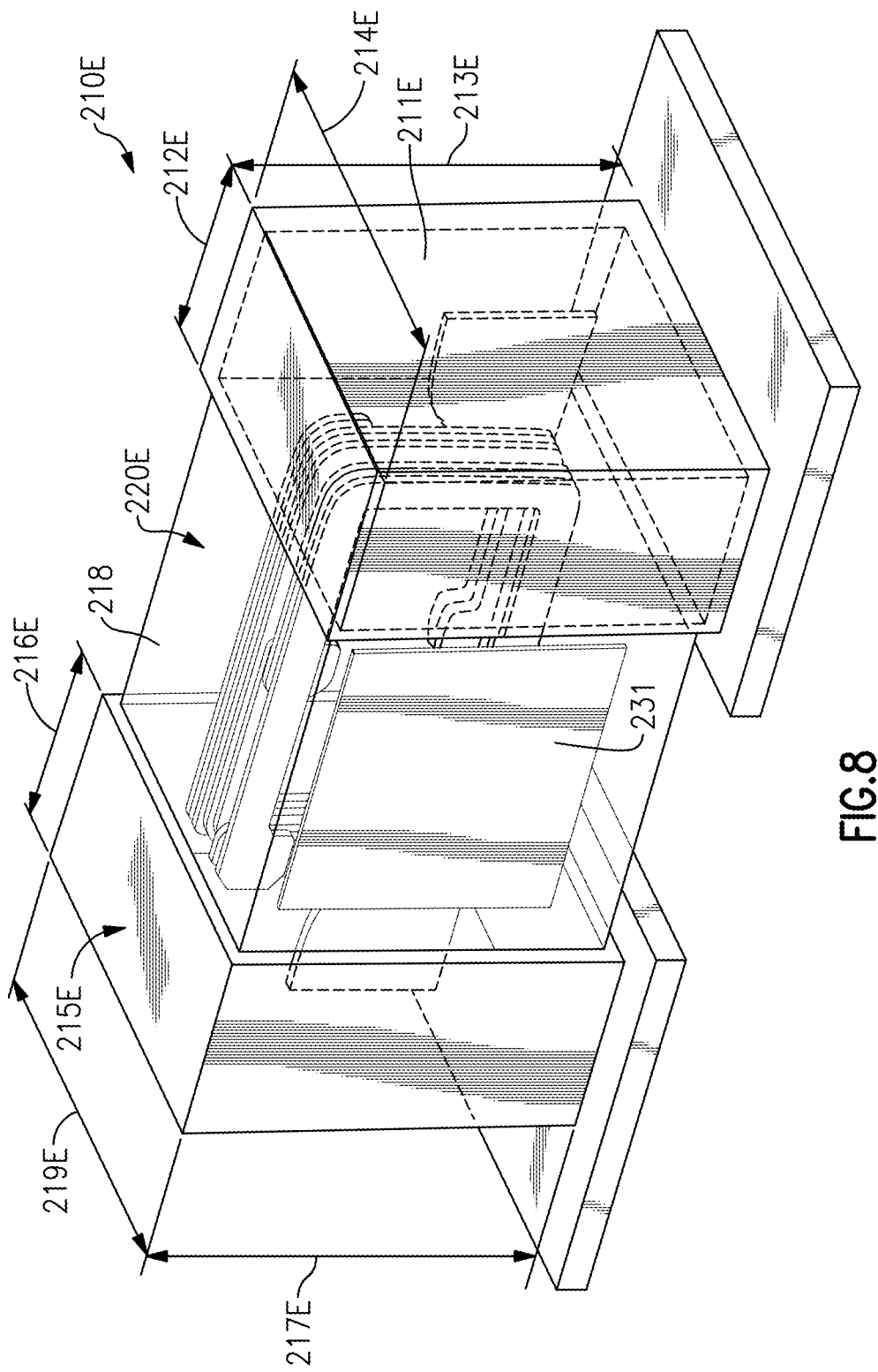
FIG. 8 is a schematic view of another SMD inductor with a vertically oriented inductor and increased shielding.

FIG. 8 shows an embodiment of a shielded inductor 210E with additional shielding relative to the surface mount inductor 210D. Some of the features of shielded inductor 210E are similar to features of the surface mount inductor 210D in FIG. 7. Thus, references numerals used to designate the various components of the shielded inductor 210E are identical to those used for identifying the corresponding components of the surface mount inductor 210D in FIG. 7, except that an "D" is added to the numerical identifiers. Therefore, the structure and description for the various features of the surface mount inductor 210D in FIG. 7 are understood to also apply to the corresponding features of the shielded inductor 210E in FIG. 8, except as described below.

The shielded inductor 210E differs from the surface mount inductor 210D in that a shield 231 (e.g., made of metal) is disposed on one side of the inductor coil 220E. The shield 231 is attached to a dielectric material (not shown, but similar to dielectric material 218 in FIG. 3) and is not attached to any metal material so it is not grounded. The greater the surface of the shield 231 relative to the inductor coil 220E, the higher the improvement in isolation (e.g., improvement in reducing crosstalk between inductors). For example, so long as the proportion of area coverage of the shield 231 relative to the size of the inductor coil 220E is at least 1:1, isolation between the inductors 210E increases (e.g., crosstalk decreases), whereas if the proportion of area coverage of the shield 231 relative to the size of the inductor coil 220E is less than 1:1, isolation between the inductors 210E increases (e.g., crosstalk increases). In one embodiment, the shielded inductor 210E can provide an inductance of 5.86 nH and have a Q factor of 24.8, and therefore exhibits approximately the same performance relative to the shielded inductor 210D, but with increased shielding. Optionally, a shield (such as the metal shield 231) can be disposed on both sides of the inductor coil 220E.

Figure 9B:
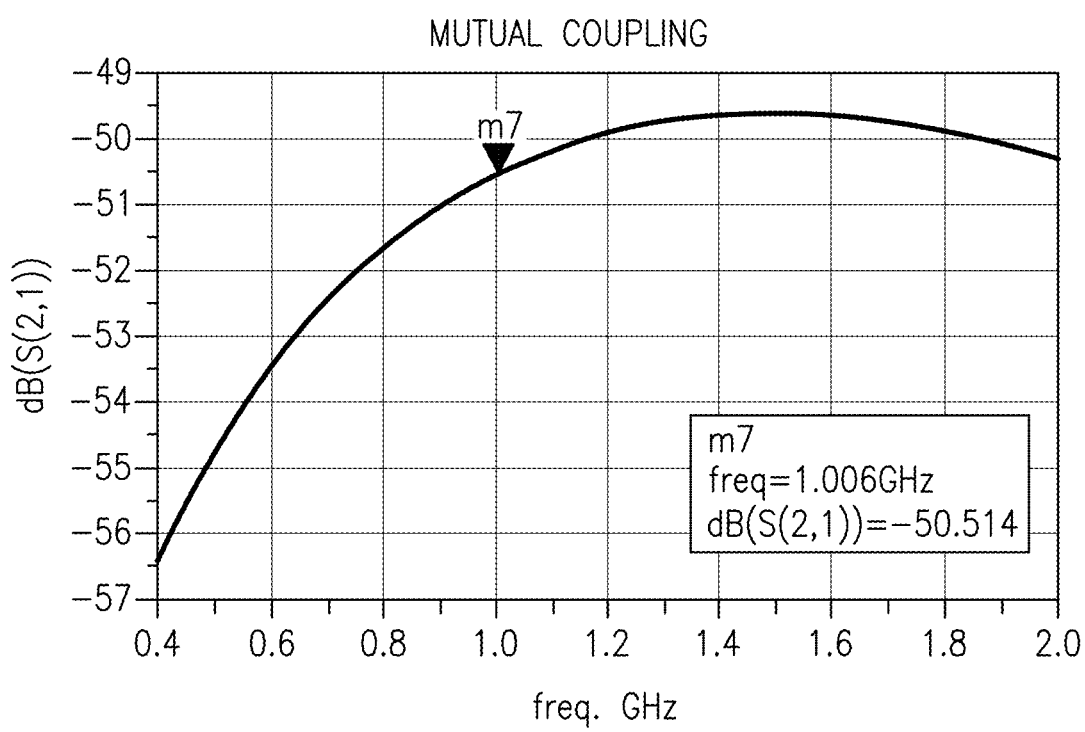
FIG. 9B is a graph of frequency versus crosstalk noise for the SMD inductors in FIG. 9A.

FIG. 9A shows a printed circuit board P with a plurality of surface mount inductors 210 (described above in connection with FIG. 3) arranged end to end and spaced part from each other by a distance W. FIG. 9B is a graph of noise versus frequency illustrating the amount of cross-talk between the surface mount inductors 210. In the graph, m7 indicates a point on the graph corresponding to an example frequency (e.g., a frequency of 1.006 GHz).

Figure 10A:
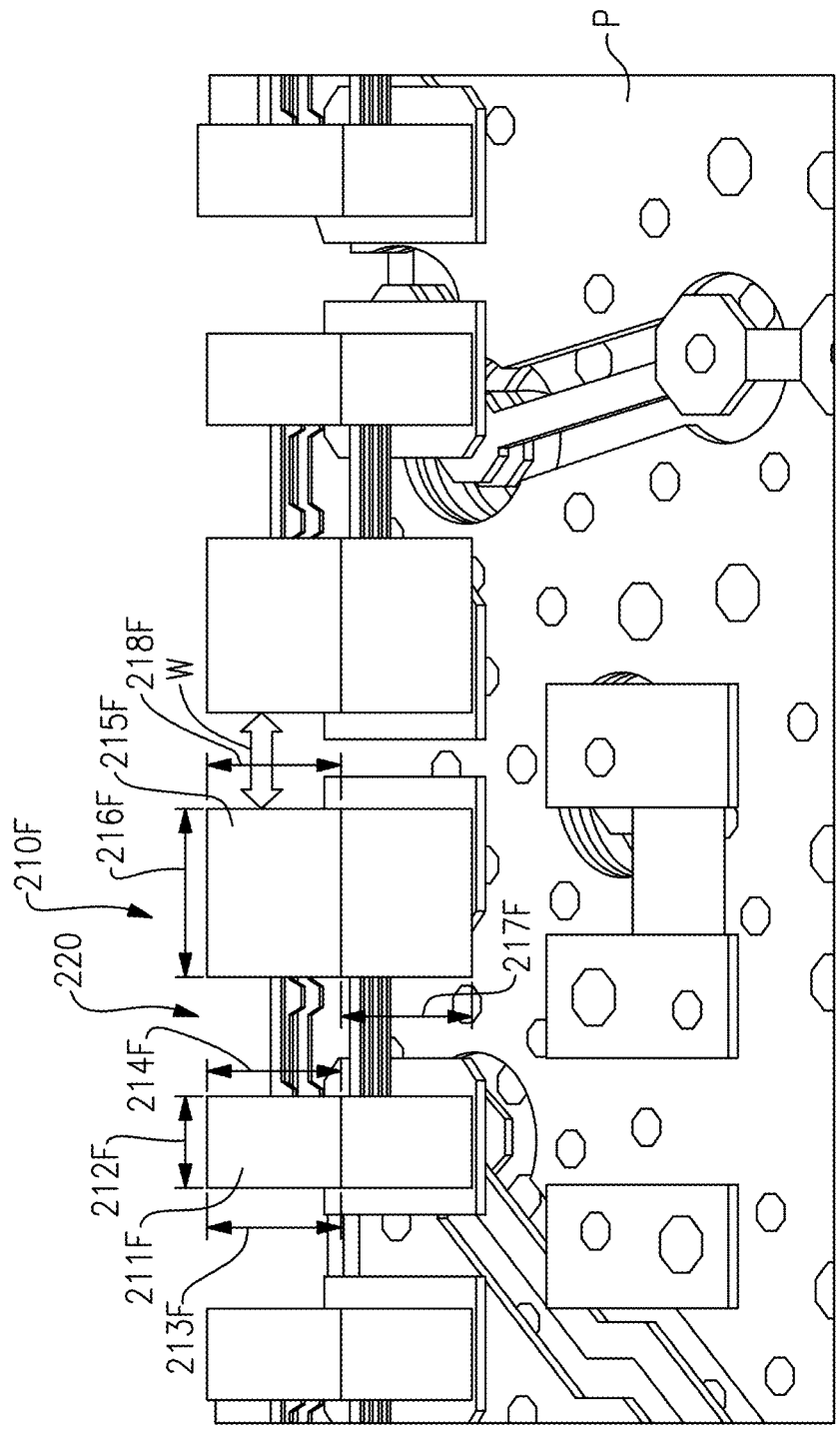
FIG. 10A is a schematic view of a packaged module with SMD inductors with horizontally oriented inductors and increased shielding.

FIG. 10A shows a printed circuit board P with a plurality of shielded inductors 210F arranged end to end and spaced apart from each other by a distance W (e.g., the same distance W as in FIG. 9A). Some of the features of shielded inductor 210F are similar to features of the shielded inductor 210A in FIG. 4. Thus, references numerals used to designate the various components of the shielded inductor 210F are identical to those used for identifying the corresponding components of the shielded inductor 210A in FIG. 4, except that an "F" is added to the numerical identifiers. Therefore, the structure and description for the various features of the shielded inductor 210A in FIG. 4 are understood to also apply to the corresponding features of the shielded inductor 210F in FIG. 10A, except as described below.

The shielded inductor 210F differs from the shielded inductor 210A in that only one of the anode structure 211F and cathode structure 215F has its length 212F, 216F increased inward toward a center or midpoint of a length of the shielded inductor 210F. That is, one of the anode structure 211F and cathode structure 215F has a greater length than the other of the anode structure 211F and cathode structure 215F).

Figure 10B:
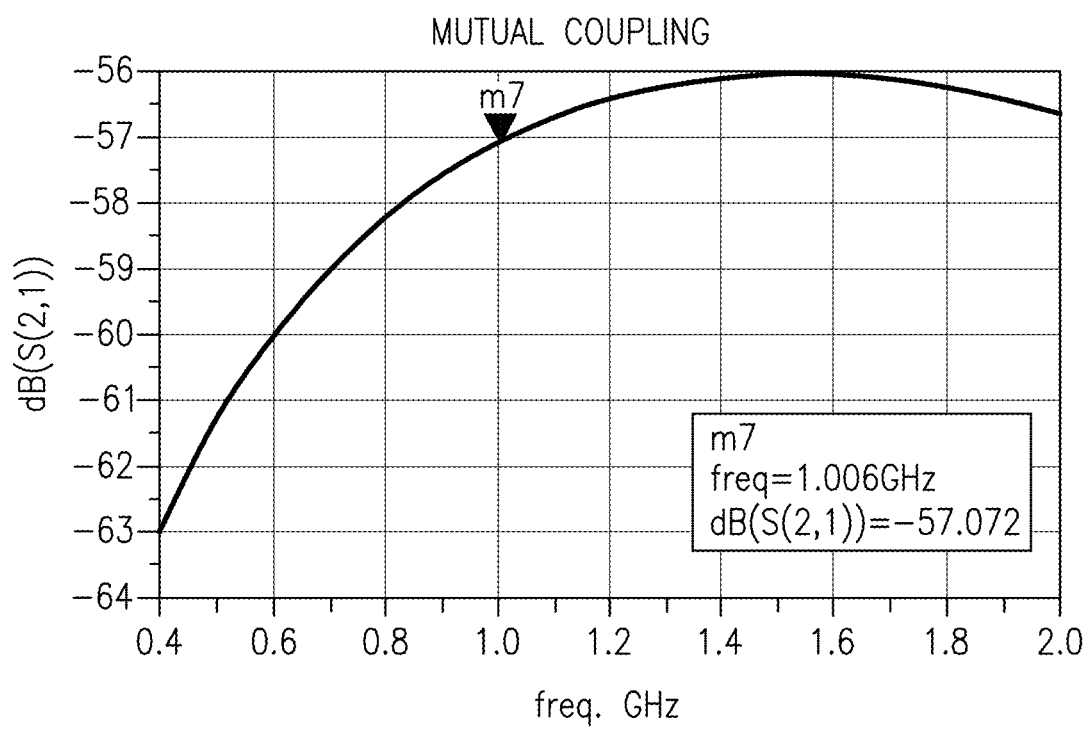
FIG. 10B is a graph of frequency versus crosstalk noise for the SMD inductors in FIG. 10A.

FIG. 10B is a graph of noise versus frequency illustrating the amount of cross-talk between the shielded inductors 210F. In the graph, m7 indicates a point on the graph corresponding to an example frequency (e.g., a frequency of 1.006 GHz). As compared to the surface mount inductors 210 (e.g., baseline) in FIG. 9A and graph 9B, the cross-talk between the shielded inductors 210F is reduced by approximately 6.5 dB.

Figure 11A:
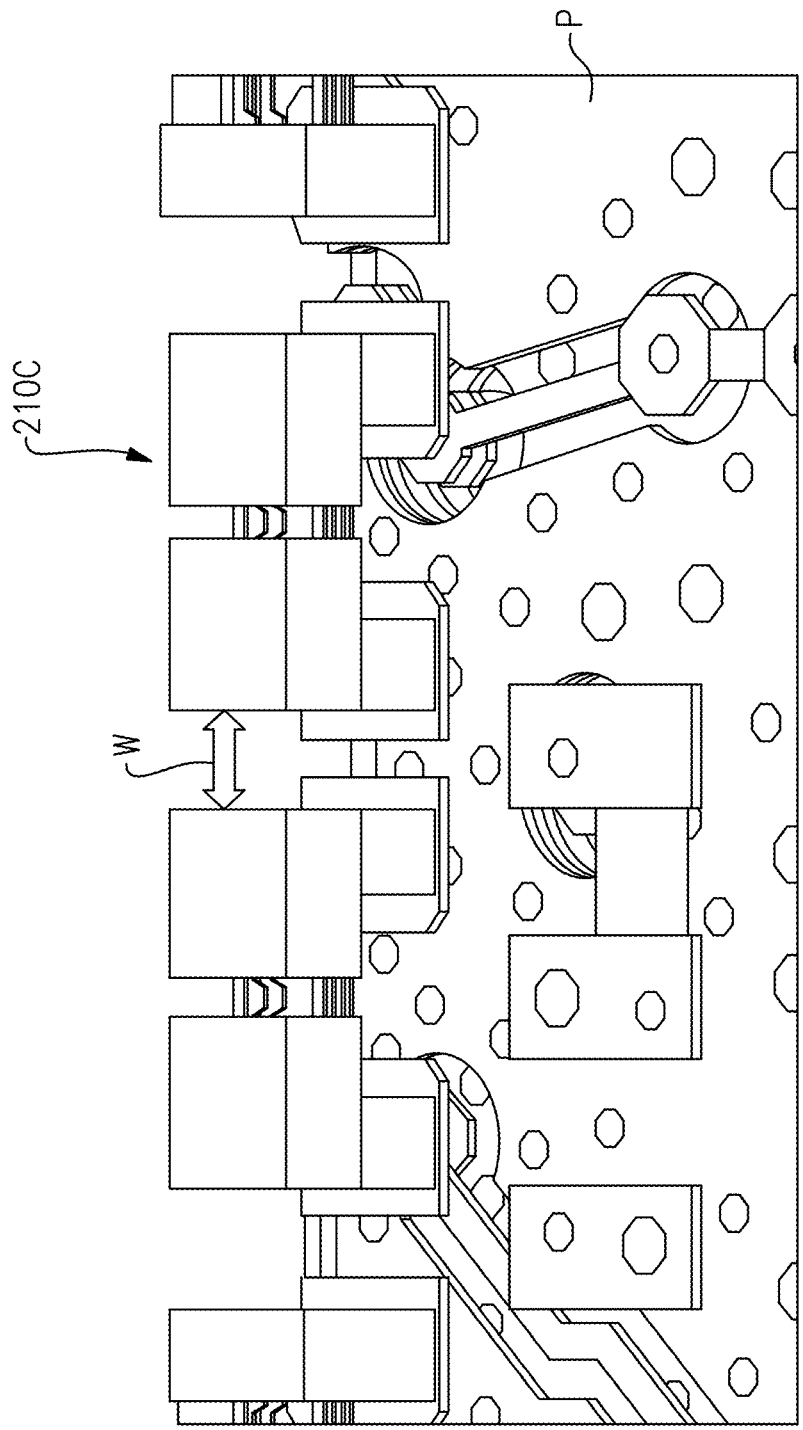
FIG. 11A is a schematic view of another packaged module with SMD inductors with horizontally oriented inductors and increased shielding.
Figure 11B:
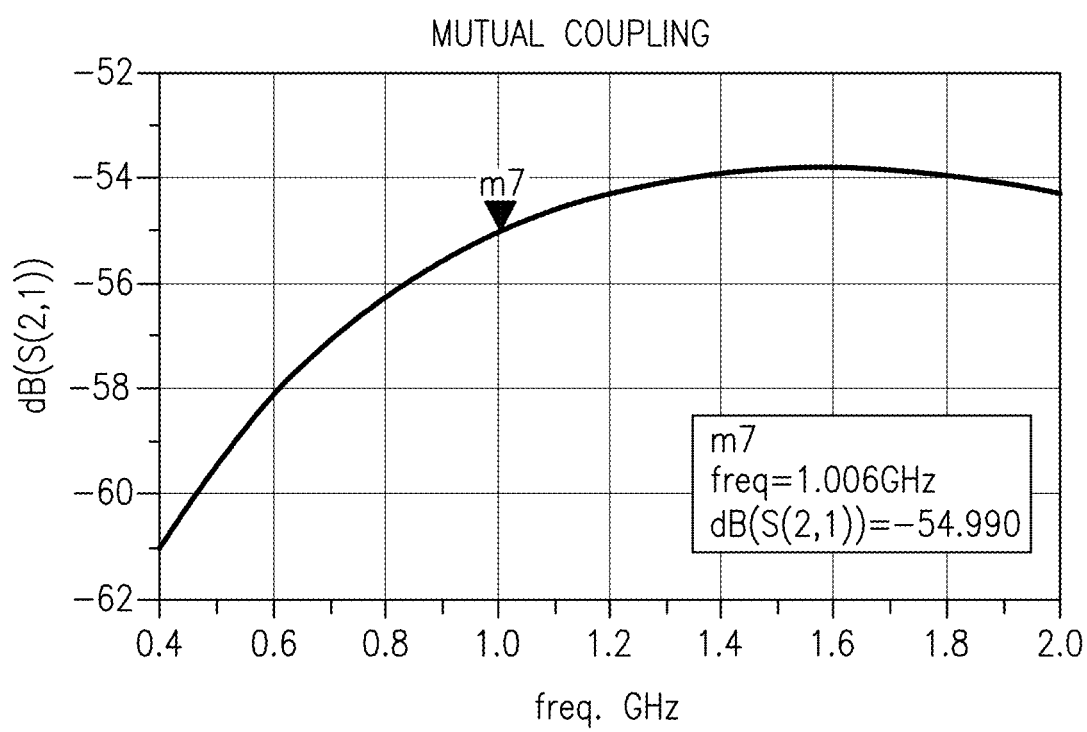
FIG. 11B is a graph of frequency versus crosstalk noise for the SMD inductors in FIG. 11A.

FIG. 11A shows a printed circuit board P with a plurality of shielded inductors 210C (described above in connection with FIG. 6) arranged end to end and spaced part from each other by a distance W (e.g., the same distance W as in FIG. 9A). FIG. 11B is a graph of noise versus frequency illustrating the amount of cross-talk between the shielded inductors 210C. In the graph, m7 indicates a point on the graph corresponding to an example frequency (e.g., a frequency of 1.006 GHz). As compared to the surface mount inductors 210 (e.g., baseline) in FIG. 9A and graph 9B, the cross-talk between the shielded inductors 210C is reduced by approximately 4.5 dB.

Figure 12A:
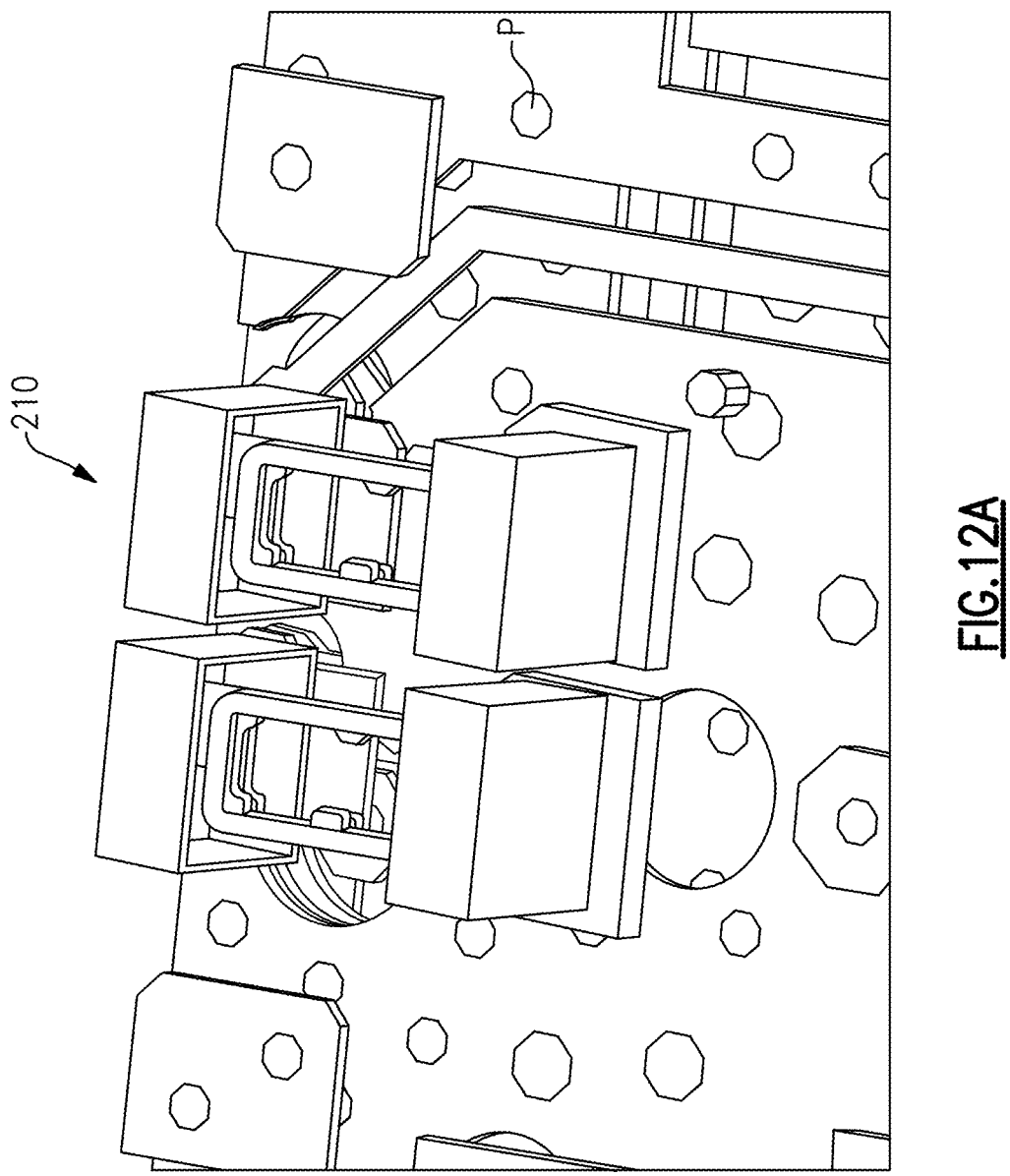
FIG. 12A is a schematic view of a packaged module with conventional side by side SMD inductors with horizontally oriented inductors.
Figure 12B:
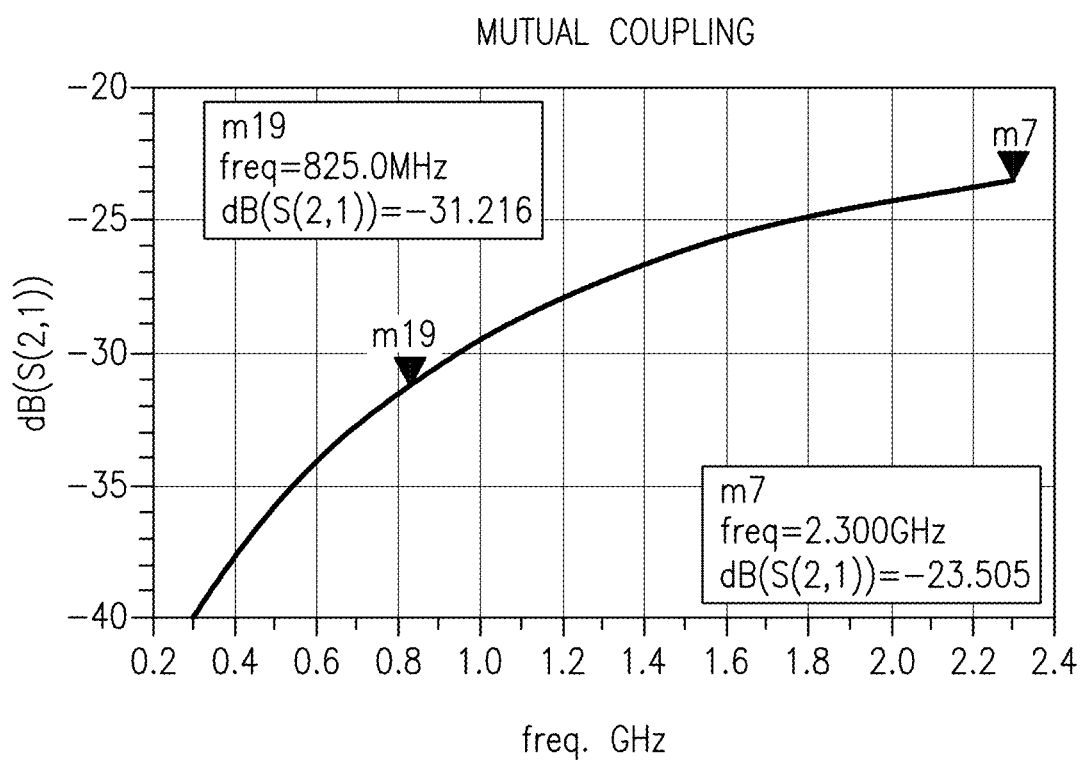
FIG. 12B is a graph of frequency versus crosstalk noise for the SMD inductors in FIG. 12A.

FIG. 12A shows a printed circuit board P with a plurality of surface mount inductors 210 (described above in connection with FIG. 3) arranged side by side (e.g., parallel to each other). FIG. 12B is a graph of noise versus frequency illustrating the amount of cross-talk between the surface mount inductors 210. In the graph, m7 indicates a point on the graph corresponding to an example frequency (e.g., a frequency of 2.300 GHz), and m19 indicates a point corresponding to another example frequency (e.g., 825.0 MHz).

Figure 13B:
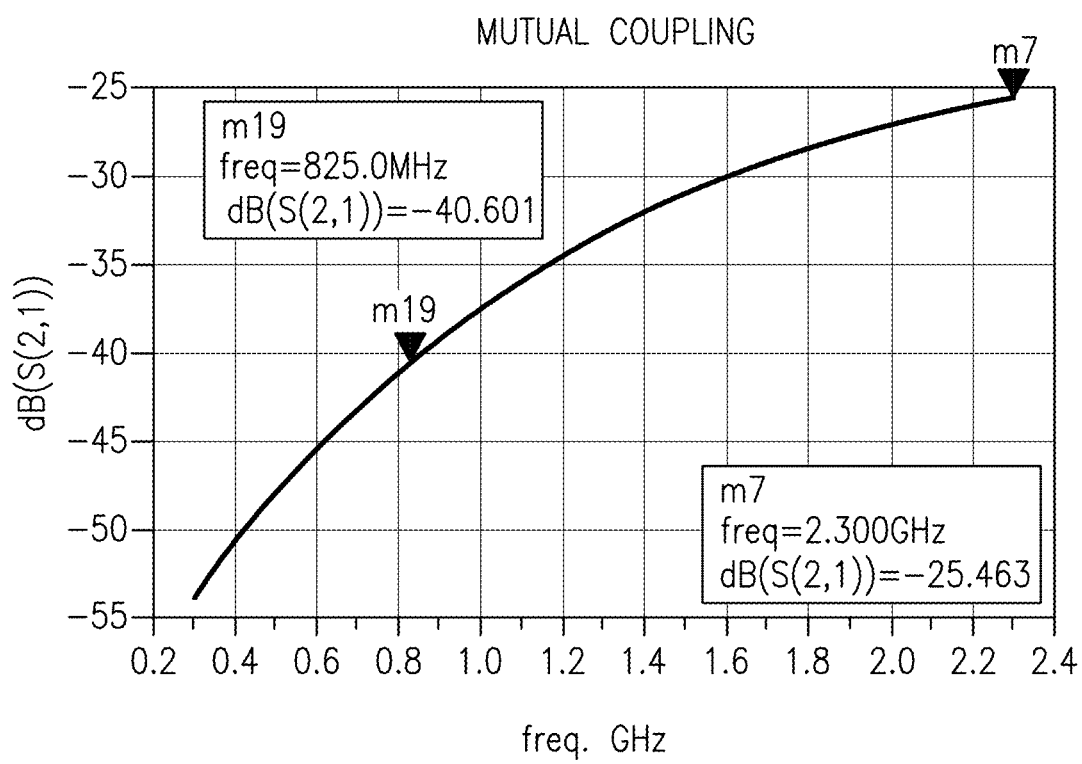
FIG. 13B is a graph of frequency versus crosstalk noise for the SMD inductors in FIG. 13A.

FIG. 13A shows a printed circuit board P with a plurality of shielded inductors 210C (described above in connection with FIG. 6) arranged side by side (e.g. extending parallel to each other along their lengths). FIG. 13B is a graph of noise versus frequency illustrating the amount of cross-talk between the shielded inductors 210C. In the graph, m7 indicates a point on the graph corresponding to an example frequency (e.g., a frequency of 2.300 GHz), and m19 indicates a point corresponding to another example frequency (e.g., 825.0 MHz). As compared to the surface mount inductors 210 (e.g., baseline) in FIG. 12A and graph 12B, the cross-talk between the shielded inductors 210C in FIGS. 13A-13B is reduced by approximately 9 dB at low frequency (e.g., of 825.0 MHz) and approximately 2 dB at high frequency (e.g., of 2.300 GHz).

Figure 14A:
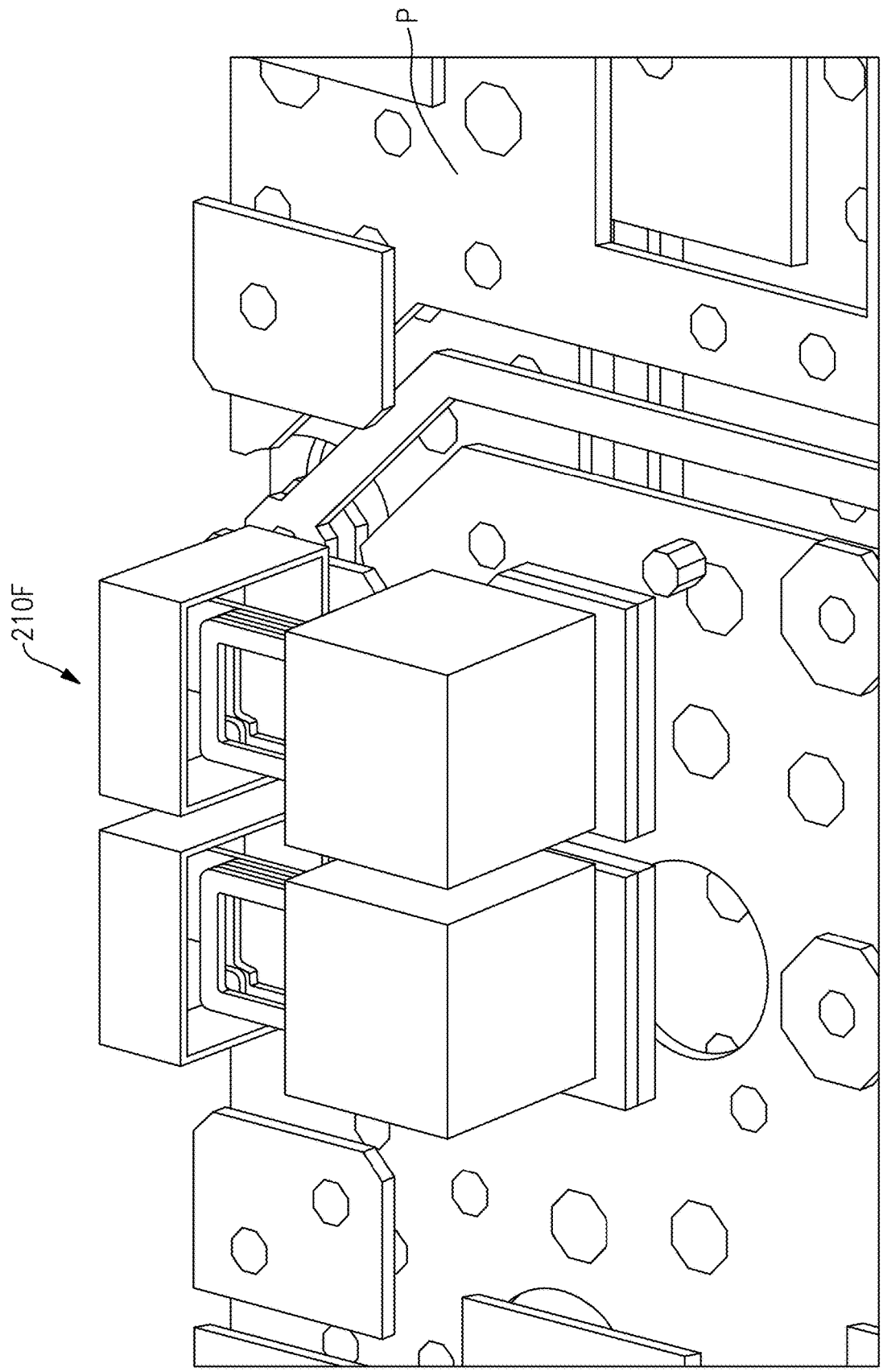
FIG. 14A is a schematic view of a packaged module with side by side SMD inductors with horizontally oriented inductors and increased shielding.
Figure 14B:
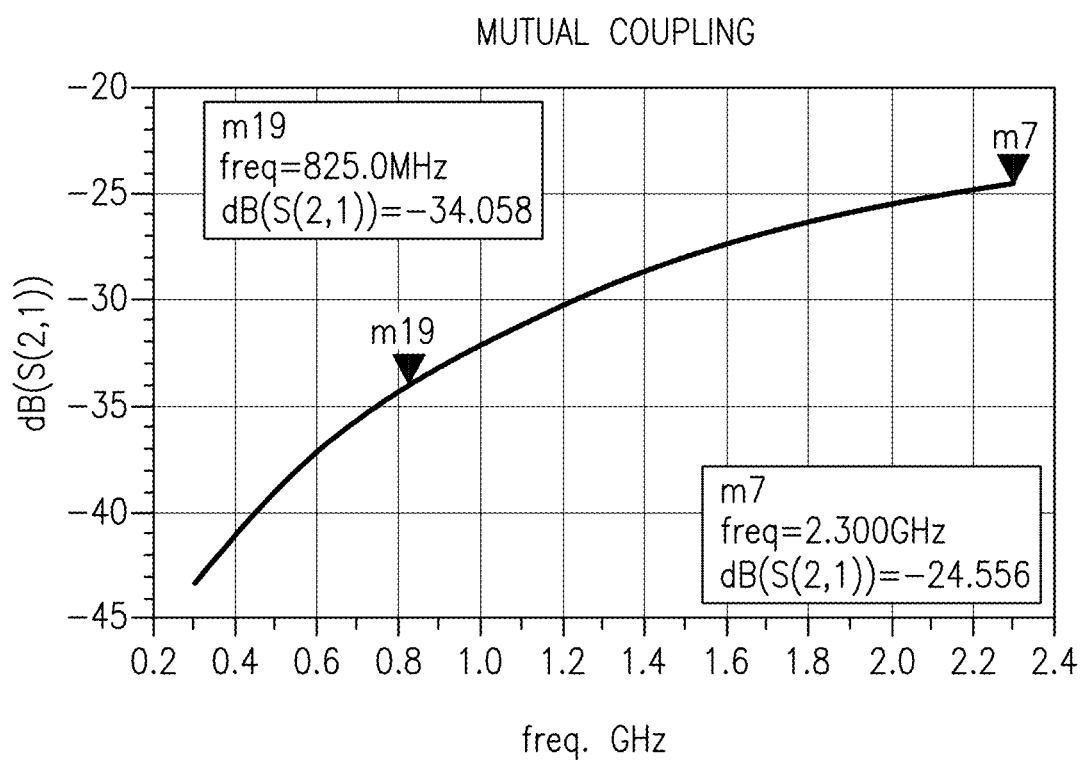
FIG. 14B is a graph of frequency versus crosstalk noise for the SMD inductors in FIG. 14A.

FIG. 14A shows a printed circuit board P with a plurality of shielded inductors 210F (described above in connection with FIG. 10A) arranged side by side (e.g. extending parallel to each other along their lengths). FIG. 14B is a graph of noise versus frequency illustrating the amount of cross-talk between the shielded inductors 210F. In the graph, m7 indicates a point on the graph corresponding to an example frequency (e.g., a frequency of 2.300 GHz), and m19 indicates a point corresponding to another example frequency (e.g., 825.0 MHz). As compared to the surface mount inductors 210 (e.g., baseline) in FIG. 12A and graph 12B, the cross-talk between the shielded inductors 210C in FIGS. 13A-13B is reduced by approximately 3 dB at low frequency (e.g., of 825.0 MHz) and approximately 1 dB at high frequency (e.g., of 2.300 GHz).

Figure 15A:
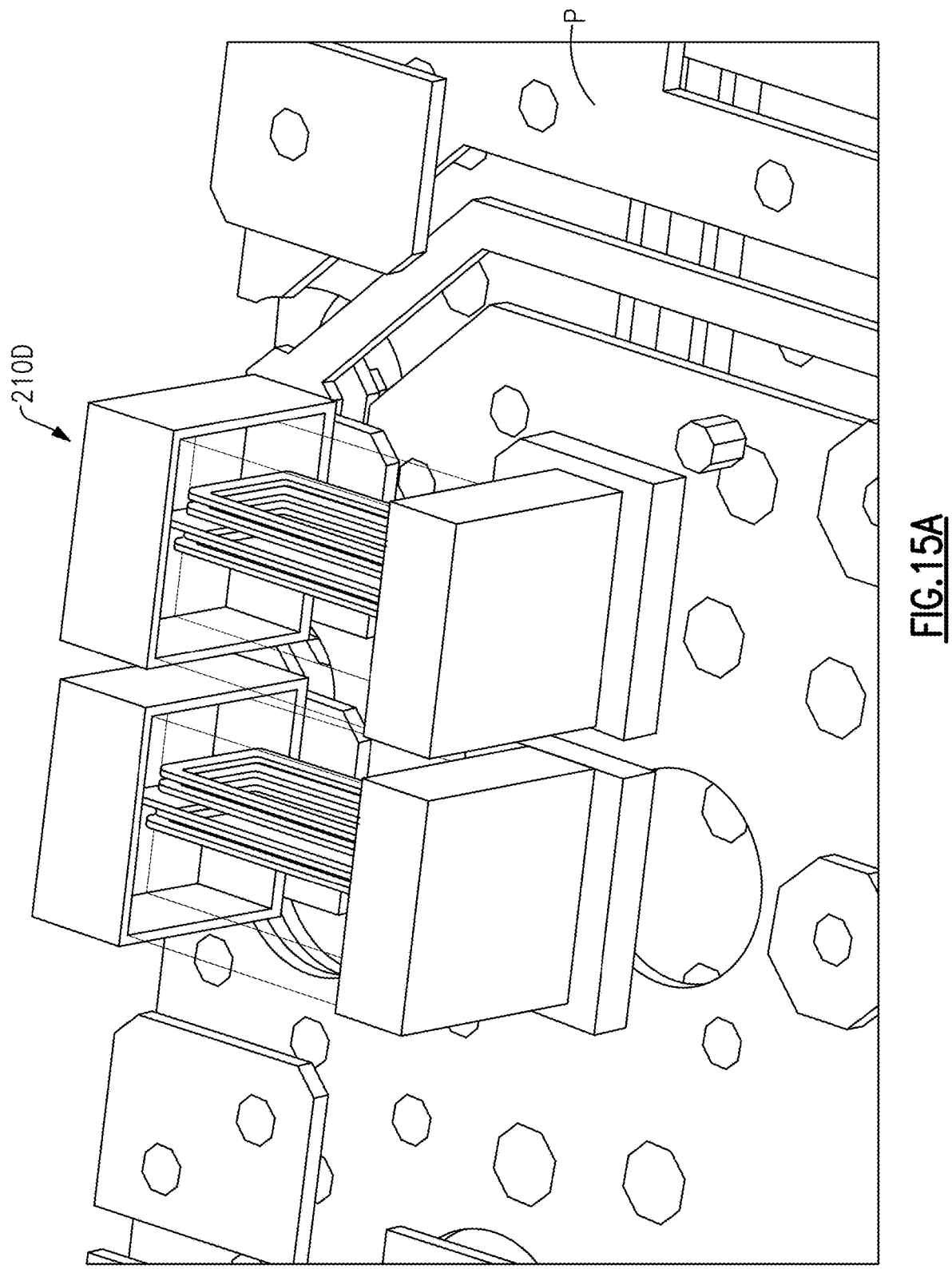
FIG. 15A is a schematic view of a packaged module with side by side conventional SMD inductors with vertically oriented inductors.
Figure 15B:
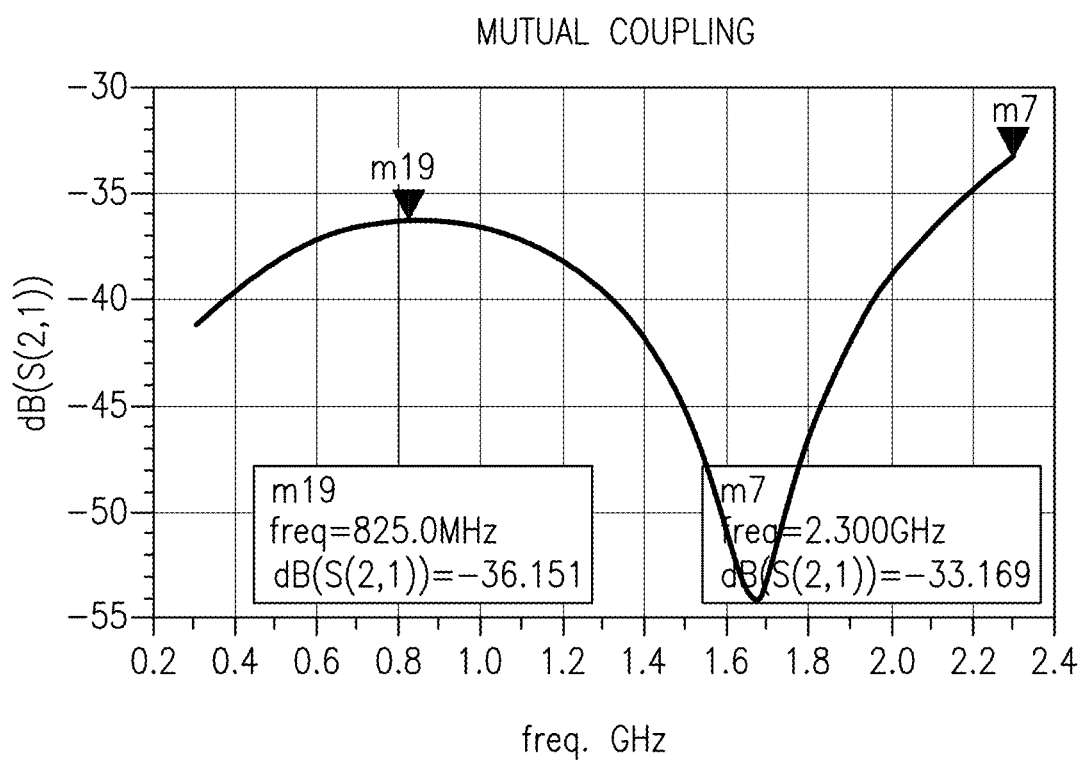
FIG. 15B is a graph of frequency versus crosstalk noise for the SMD inductors in FIG. 15A.

FIG. 15A shows a printed circuit board P with a plurality of surface mount inductors 210D (described above in connection with FIG. 7) arranged side by side (e.g., parallel to each other along their lengths). FIG. 15B is a graph of noise versus frequency illustrating the amount of cross-talk between the surface mount inductors 210D. In the graph, m7 indicates a point on the graph corresponding to an example frequency (e.g., a frequency of 2.300 GHz), and m19 indicates a point corresponding to another example frequency (e.g., 825.0 MHz).

Figure 16A:
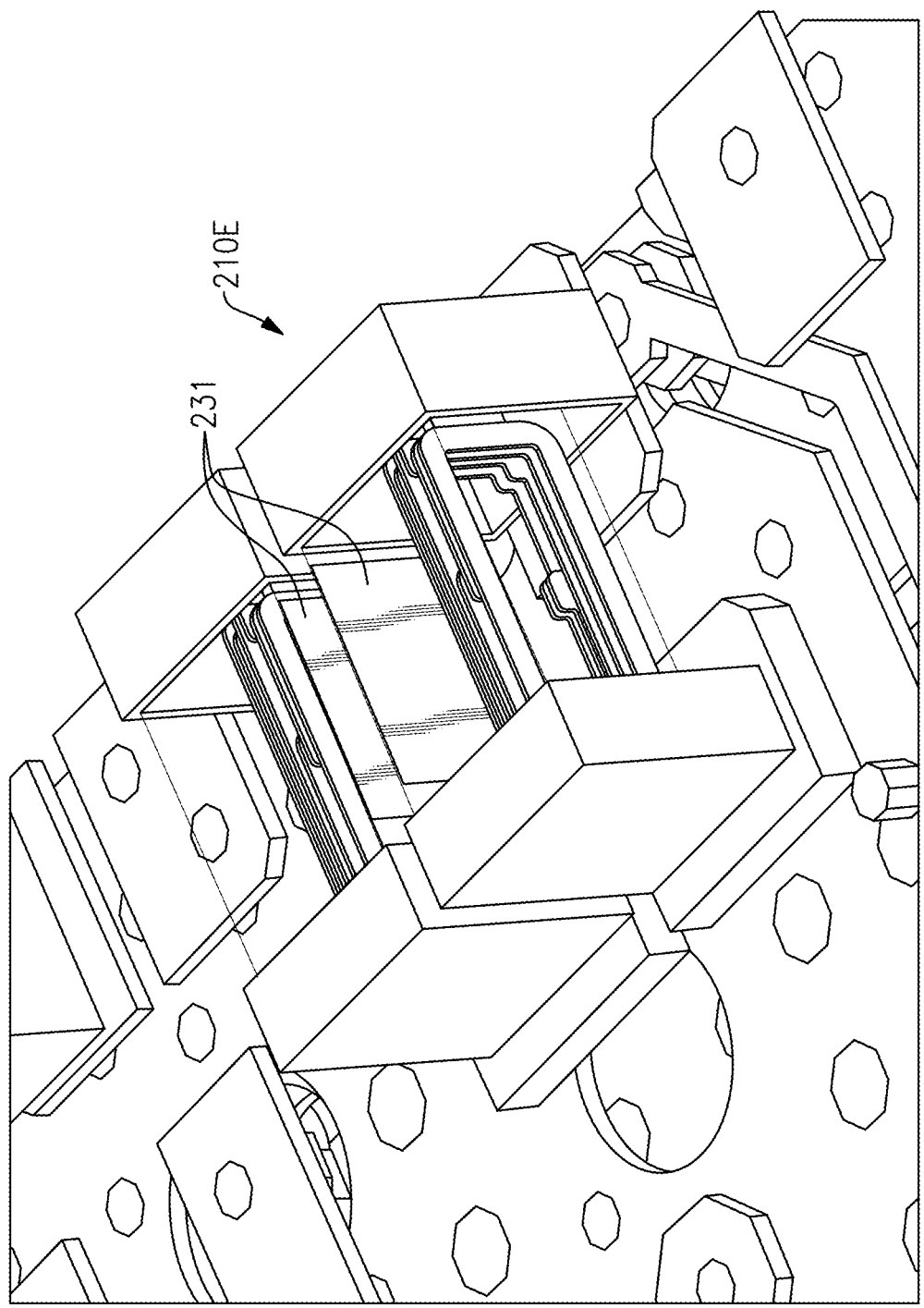
FIG. 16A is a schematic view of a packaged module with side by side SMD inductors with vertically oriented inductors and increased shielding.
Figure 16B:
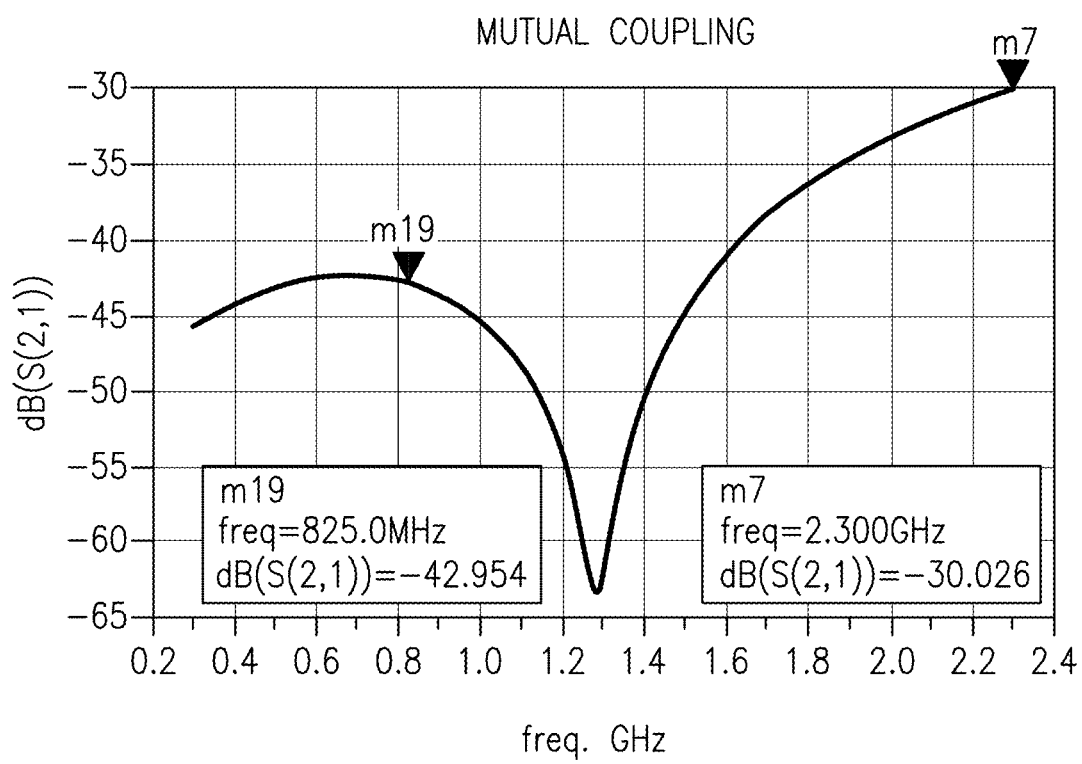
FIG. 16B is a graph of frequency versus crosstalk noise for the SMD inductors in FIG. 16A.

FIG. 16A shows a printed circuit board P with a plurality of shielded inductors 210E (described above in connection with FIG. 8) arranged side by side (e.g., parallel to each other along their lengths so that their shields 231 are adjacent each other). FIG. 16B is a graph of noise versus frequency illustrating the amount of cross-talk between the shielded inductors 210E. In the graph, m7 indicates a point on the graph corresponding to an example frequency (e.g., a frequency of 2.300 GHz), and m19 indicates a point corresponding to another example frequency (e.g., 825.0 MHz). As compared to the surface mount inductors 210D (e.g., baseline) in FIG. 15A and FIG. 15B, the cross-talk between the shielded inductors 210E in FIGS. 16A-16B is reduced by approximately 9 dB at low frequency (e.g., of 825.0 MHz) and approximately 3 dB at high frequency (e.g., of 2.300 GHz). Additionally, the shielded inductors 210E in FIGS. 16A-16B have about the same Q value as the surface mount inductors 210D in FIGS. 15A-15B.

Advantageously, the shielded inductors, such as the shielded inductors 210C, 210E and 210F, provide improved shielding in the direction of the magnetic flux by covering a larger area of the inductor coil 220, 220E on one side (e.g., a top side in inductors 210C, 210F and a left or right side in inductor 210E). The shielded inductors 210C, 210E, 210F provide improvements in crosstalk reduction with a small impact on Q value.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a sub combination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the shielded inductor need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed shielded inductor.

What is claimed is:

1. A surface mount device inductor mountable on a printed circuit board, comprising:
   an inductor coil configured to generate a magnetic field along an axis when a current is applied to the inductor coil;
   a dielectric material disposed about the inductor coil;
   an anode structure disposed over and at least partially enclosing a first end of the inductor coil;
   a cathode structure disposed over and at least partially enclosing a second end of the inductor coil opposite the first end, the cathode structure being spaced apart from the anode structure; and
   a shield portion disposed at least partially over the inductor coil and extending along a plane that extends generally transverse to the axis to thereby reduce electromagnetic coupling between adjacent surface mount device inductors, the shield portion defined by one or both of a top wall of the anode structure and a top wall of the cathode structure that is spaced apart from the top wall of the anode structure.

2. The surface mount device inductor of claim 1 wherein the shield portion is an ungrounded metal portion attached to a surface of the dielectric material.

3. The surface mount device inductor of claim 2 wherein the ungrounded metal portion is attached to only one surface of the dielectric material.

4. The surface mount device inductor of claim 1 wherein the shield portion is defined by the top wall of one of the anode structure and the cathode structure that has a greater length than the top wall of the other of the anode structure and the cathode structure.

5. The surface mount device inductor of claim 1 wherein the shield portion is defined by the top wall of the anode and cathode structures that extend over a majority of the inductor coil, at least a portion of a left-side wall and a right-side wall of the anode and cathode structures that extend in a lengthwise direction of the inductor extending from the top wall to a location spaced above the substrate.

6. The surface mount device inductor of claim 1 wherein the axis extends transverse to a plane that defines a left-side wall of one or both of the anode structure and the cathode structure.

7. The surface mount device inductor of claim 1 wherein the axis extends transverse to a plane that defines a top wall of one or both of the anode structure and the cathode structure.

8. A radiofrequency module, comprising:
   a printed circuit board including a substrate layer;
   one or more surface mount device inductors mounted on the substrate layer, each surface mount device inductor including: an inductor coil configured to generate a magnetic field along an axis when a current is applied to the inductor coil; a dielectric material disposed about the inductor coil; an anode structure disposed over and at least partially enclosing a first end of the inductor coil; a cathode structure disposed over and at least partially enclosing a second end of the inductor coil opposite the first end, the cathode structure being spaced apart from the anode structure; and a shield portion disposed at least partially over the inductor coil and extending along a plane extending generally transverse to the axis to thereby reduce electromagnetic coupling between adjacent surface mount device inductors, the shield portion defined by one or both of a top wall of the anode structure and a top wall of the cathode structure that is spaced apart from the top wall of the anode structure.

9. The radiofrequency module of claim 8 wherein the shield portion is an ungrounded metal portion attached to a surface of the dielectric material.

10. The radiofrequency module of claim 9 wherein the ungrounded metal portion is attached to only one surface of the dielectric material.

11. The radiofrequency module of claim 8 wherein the shield portion is defined by the top wall of one of the anode structure and the cathode structure that has a greater length than the top wall of the other of the anode structure and the cathode structure.

12. The radiofrequency module of claim 8 wherein the shield portion is defined by the top wall of the anode and cathode structures that extend over a majority of the inductor coil, at least a portion of a left-side wall and a right-side wall of the anode and cathode structures that extend in a lengthwise direction of the inductor extending from the top wall to a location spaced above the substrate.

13. The radiofrequency module of claim 8 wherein the axis extends transverse to a plane that defines a left-side wall of one or both of the anode structure and the cathode structure.

14. The radiofrequency module of claim 8 wherein the axis extends transverse to a plane that defines a top wall of one or both of the anode structure and the cathode structure.

15. A wireless mobile device comprising:
one or more antennas;
a front end system that communicates with the one or more antennas, the front end system including one or more surface mount device inductors mounted on a substrate layer, each surface mount device inductor including: an inductor coil configured to generate a magnetic field along an axis when a current is applied to the inductor coil; a dielectric material disposed about the inductor coil; an anode structure disposed over and at least partially enclosing a first end of the inductor coil; a cathode structure disposed over and at least partially enclosing a second end of the inductor coil opposite the first end, the cathode structure being spaced apart from the anode structure; and a shield portion disposed at least partially over the inductor coil and extending along a plane extending generally transverse to the axis to thereby reduce electromagnetic coupling between adjacent surface mount device inductors, the shield portion defined by one or both of a top wall of the anode structure and a top wall of the cathode structure that is spaced apart from the top wall of the anode structure.

16. The wireless mobile device of claim 15 wherein the shield portion is an ungrounded metal portion attached to a surface of the dielectric material.

17. The wireless mobile device of claim 16 wherein the ungrounded metal portion is attached to only one surface of the dielectric material.

18. The wireless mobile device of claim 15 wherein the shield portion is defined by the top wall of one of the anode structure and the cathode structure that has a greater length than the top wall of the other of the anode structure and the cathode structure.

19. The wireless mobile device of claim 15 wherein the shield portion is defined by the top wall of the anode and cathode structures that extend over a majority of the inductor coil, at least a portion of a left-side wall and a right-side wall of the anode and cathode structures that extend in a lengthwise direction of the inductor extending from the top wall to a location spaced above the substrate.

20. The wireless mobile device of claim 15 wherein the axis extends transverse to a plane that defines a left-side wall of one or both of the anode structure and the cathode structure.

21. The wireless mobile device of claim 15 wherein the axis extends transverse to a plane that defines a top wall of one or both of the anode structure and the cathode structure.

* * * * *